United States Patent
Ji et al.

(10) Patent No.: US 9,989,197 B2
(45) Date of Patent: Jun. 5, 2018

(54) OPTICAL DEVICE AND LIGHT SOURCE MODULE INCLUDING THE SAME

(71) Applicant: SAMSUNG ELECTRONICS CO., LTD., Suwon-si (KR)

(72) Inventors: Won Soo Ji, Hwaseong-si (KR); Tetsuo Ariyoshi, Suwon-si (KR); Sang Woo Ha, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 21 days.

(21) Appl. No.: 15/158,726

(22) Filed: May 19, 2016

(65) Prior Publication Data

US 2016/0356453 A1    Dec. 8, 2016

(30) Foreign Application Priority Data

Jun. 5, 2015   (KR) .................. 10-2015-0080006

(51) Int. Cl.
| | | |
|---|---|---|
| *F21V 3/00* | (2015.01) | |
| *F21V 5/00* | (2018.01) | |
| *F21K 9/23* | (2016.01) | |
| *G02F 1/1335* | (2006.01) | |
| *G02B 3/00* | (2006.01) | |
| *F21K 9/27* | (2016.01) | |
| *H01L 33/58* | (2010.01) | |
| *G02B 7/02* | (2006.01) | |
| *G02B 19/00* | (2006.01) | |
| *F21K 9/69* | (2016.01) | |
| *F21V 5/04* | (2006.01) | |
| *F21V 17/10* | (2006.01) | |

(Continued)

(52) U.S. Cl.
CPC .................. *F21K 9/23* (2016.08); *F21K 9/27* (2016.08); *F21K 9/69* (2016.08); *G02B 3/00* (2013.01); *G02B 7/022* (2013.01); *G02B 19/0014* (2013.01); *G02B 19/0061* (2013.01); *G02F 1/1335* (2013.01); *H01L 33/58* (2013.01); *F21V 5/04* (2013.01); *F21V 17/101* (2013.01); *F21Y 2103/10* (2016.08); *F21Y 2115/10* (2016.08)

(58) Field of Classification Search
CPC ... F21V 5/048; F21K 9/23; F21K 9/27; G02B 3/00; G02B 7/022; G02B 19/0014; G02B 19/0061; G02B 1/335; H01L 33/58
See application file for complete search history.

(56) References Cited

U.S. PATENT DOCUMENTS

| | | | |
|---|---|---|---|
| 6,372,608 | B1 | 4/2002 | Shimoda et al. |
| 6,473,554 | B1 | 10/2002 | Pelka et al. |

(Continued)

FOREIGN PATENT DOCUMENTS

| | | | |
|---|---|---|---|
| JP | 2006-303122 A | 11/2006 | |
| JP | 2008-226302 A | 9/2008 | |

(Continued)

*Primary Examiner* — Laura Gudorf
(74) *Attorney, Agent, or Firm* — Sughrue Mion, PLLC

(57) ABSTRACT

An optical device and a light source module including the same are provided. The optical device includes a first surface having an incident portion; a second surface emitting light incident through the incident portion outwardly; a support portion protruding from the first surface; and a blocking portion surrounding an outer portion of the support portion, the blocking portion being stepped with respect to the first surface.

16 Claims, 18 Drawing Sheets

(51) Int. Cl.
*F21Y 103/10* (2016.01)
*F21Y 115/10* (2016.01)

(56) References Cited

U.S. PATENT DOCUMENTS

| | | | |
|---|---|---|---|
| 6,645,830 | B2 | 11/2003 | Shimoda et al. |
| RE38,466 | E | 3/2004 | Inoue et al. |
| 6,818,465 | B2 | 11/2004 | Biwa et al. |
| 6,818,530 | B2 | 11/2004 | Shimoda et al. |
| 6,858,081 | B2 | 2/2005 | Biwa et al. |
| 6,967,353 | B2 | 11/2005 | Suzuki et al. |
| 7,002,182 | B2 | 2/2006 | Okuyama et al. |
| 7,084,420 | B2 | 8/2006 | Kim et al. |
| 7,087,932 | B2 | 8/2006 | Okuyama et al. |
| 7,153,002 | B2 | 12/2006 | Kim et al. |
| 7,154,124 | B2 | 12/2006 | Han et al. |
| 7,208,725 | B2 | 4/2007 | Sherrer et al. |
| 7,288,758 | B2 | 10/2007 | Sherrer et al. |
| 7,319,044 | B2 | 1/2008 | Han et al. |
| 7,501,656 | B2 | 3/2009 | Han et al. |
| 7,549,769 | B2 | 6/2009 | Kim et al. |
| 7,709,857 | B2 | 5/2010 | Kim et al. |
| 7,759,140 | B2 | 7/2010 | Lee et al. |
| 7,781,727 | B2 | 8/2010 | Sherrer et al. |
| 7,790,482 | B2 | 9/2010 | Han et al. |
| 7,940,350 | B2 | 5/2011 | Jeong |
| 7,959,312 | B2 | 6/2011 | Yoo et al. |
| 7,964,881 | B2 | 6/2011 | Choi et al. |
| 7,985,976 | B2 | 7/2011 | Choi et al. |
| 7,994,525 | B2 | 8/2011 | Lee et al. |
| 8,008,683 | B2 | 8/2011 | Choi et al. |
| 8,013,351 | B2 | 9/2011 | Hsiao et al. |
| 8,013,352 | B2 | 9/2011 | Lee et al. |
| 8,049,161 | B2 | 11/2011 | Sherrer et al. |
| 8,106,859 | B2 | 1/2012 | Ohkawa et al. |
| 8,129,711 | B2 | 3/2012 | Kang et al. |
| 8,179,938 | B2 | 5/2012 | Kim |
| 8,263,987 | B2 | 9/2012 | Choi et al. |
| 8,324,646 | B2 | 12/2012 | Lee et al. |
| 8,399,944 | B2 | 3/2013 | Kwak et al. |
| 8,432,511 | B2 | 4/2013 | Jeong |
| 8,459,832 | B2 | 6/2013 | Kim |
| 8,502,242 | B2 | 8/2013 | Kim |
| 8,536,604 | B2 | 9/2013 | Kwak et al. |
| 8,735,931 | B2 | 5/2014 | Han et al. |
| 8,766,295 | B2 | 7/2014 | Kim |
| 2003/0235050 | A1 | 12/2003 | West et al. |
| 2006/0066218 | A1 | 3/2006 | Yamaguchi et al. |
| 2007/0284993 | A1 | 12/2007 | Kim et al. |
| 2009/0052192 | A1 | 2/2009 | Kokubo et al. |
| 2010/0085763 | A1 | 4/2010 | Aguglia |
| 2012/0268949 | A1 | 10/2012 | Parkyn |
| 2013/0308320 | A1* | 11/2013 | Kawahara ............... F21V 5/04 362/311.09 |
| 2014/0376219 | A1 | 12/2014 | Ono et al. |
| 2015/0023021 | A1 | 1/2015 | Hyun et al. |
| 2015/0036353 | A1* | 2/2015 | Kim ..................... H01L 33/58 362/311.02 |

FOREIGN PATENT DOCUMENTS

| | | |
|---|---|---|
| JP | 2011-27928 A | 2/2011 |
| JP | 2011-34770 A | 2/2011 |
| JP | 2012-216763 A | 11/2012 |
| JP | 5095576 B2 | 12/2012 |
| JP | 2013-21136 A | 1/2013 |
| JP | 5296002 B2 | 9/2013 |
| KR | 10-0919599 B1 | 9/2009 |
| KR | 10-1027436 B1 | 4/2011 |
| KR | 10-1041018 B1 | 6/2011 |
| KR | 10-1299529 B1 | 8/2013 |

* cited by examiner

OPTICAL DEVICE AND LIGHT SOURCE MODULE INCLUDING THE SAME

CROSS-REFERENCE TO RELATED APPLICATION

This application claims priority from Korean Patent Application No. 10-2015-0080006, filed on Jun. 5, 2015 in the Korean Intellectual Property Office, the disclosure of which is incorporated herein by reference.

BACKGROUND

Apparatuses, devices, and articles of manufacture consistent with the present disclosure relate to an optical device and a light source module including the same.

Among lenses used in light emitting device packages, wide beam angle lenses are used to spread light laterally over a wide region from a central portion thereof, using refraction. In a process of attaching the lens to a substrate during the manufacturing of a light source module, an adhesive may be spread to be partially adhered to the lens. Due to the adhesive, light emitted by a light source proceeds along a changed light path and thus, light emitted outwardly from the lens may not be uniformly spread. In addition, due to a non-uniform distribution of the spread light, defects in optical uniformity such as Mura may occur in lighting devices or display devices.

SUMMARY

One or more exemplary embodiments provide an optical device and/or a light source module with increased optical uniformity.

According to an aspect of an exemplary embodiment, there is provided an optical device including a first surface having an incident portion; a second surface configured to emit light incident through the incident portion outwardly; a support portion protruding from the first surface; and a blocking portion surrounding an outer portion of the support portion, the blocking portion being stepped with respect to the first surface.

The support portion may protrude in a protrusion direction, and the blocking portion may have a groove structure recessed in the first surface in a direction opposite to the protrusion direction of the support portion.

The blocking portion may contact a side surface of the support portion such that a proximal end of the support portion is exposed by the blocking portion by a distance equal to a recessed depth of the blocking portion.

The blocking portion may be spaced apart from the side surface of the support portion by a distance, and a region spaced apart by the distance may surround the support portion.

The blocking portion may include a first groove recessed from the first surface to a first depth, and a second groove recessed to a second depth greater than the first depth and disposed between the first groove and the support portion.

The support portion may protrude in a protrusion direction, and the blocking portion may have a dam structure in which the blocking portion protrudes in parallel in the protrusion direction with the support portion, the dam structure provided at a position spaced apart from the support portion along the first surface.

The blocking portion may have a protrusion length shorter than a protrusion length of the support portion.

The first surface may have a cavity in a central portion thereof, the cavity being recessed toward the second surface to define the incident portion.

The second surface may protrude convexly in a proceeding direction of light along an optical axis Z, and a central portion of the second surface through which the optical axis Z passes may have an inflection point recessed concavely toward the first surface.

The second surface may have a first curved surface recessed concavely toward the first surface along an optical axis thereof, and a second curved surface having a convex curve surface continuously extended from the first curved surface to an edge.

According to another aspect of an exemplary embodiment, there is provided a light source module including a substrate: a light source mounted on the substrate; and an optical device disposed above the light source, wherein the optical device includes a first surface having an incident portion; a second surface configured to emit light incident through the incident portion outwardly; a support portion protruding from the first surface and fixed to the substrate using an adhesive; and a blocking portion surrounding an outer portion of the support portion to prevent the adhesive from being spread along the first surface from the support portion, the blocking portion being stepped with respect to the first surface.

The incident portion may be positioned in a central position of the first surface, and the support portion may include a plurality of support portions provided between the incident portion and an outer edge of the first surface, and arranged around the incident portion, and the blocking portion may be provided for each of the plurality of support portions and may be disposed surrounding an outer portion of each of the plurality of support portions.

The first surface may have a cavity recessed toward the second surface to define the incident portion, in a central portion thereof, the cavity being disposed to face the light source.

The light source may include a light emitting diode (LED) chip or a LED package on which the LED chip is mounted.

The light source may further include an encapsulating part covering the LED chip.

According to another aspect of an exemplary embodiment, there is provided a light source module including a substrate; and an optical device that covers a light source and that is disposed on the substrate, the optical device including a surface extending parallel to the substrate; a protrusion extending perpendicular to the surface and fixed to the substrate via an adhesive applied to at least sides thereof; and a groove surrounding the protrusion that prevents the adhesive from spreading along the surface from the sides of the protrusion.

The groove may be formed in the surface.

The groove may be spaced apart along the surface by a distance from a side of the protrusion.

The groove may include a first groove having a first depth into the surface and a second groove having a second depth into the surface greater than the first depth.

The light source module may further include a dam protrusion that extends perpendicular to the surface and is spaced apart from the protrusion by a distance to define the groove.

BRIEF DESCRIPTION OF DRAWINGS

The above and/or other aspects will be more clearly understood from the following detailed description of exemplary embodiments taken in conjunction with the accompanying drawings, in which.

DETAILED DESCRIPTION

Figure 1A:
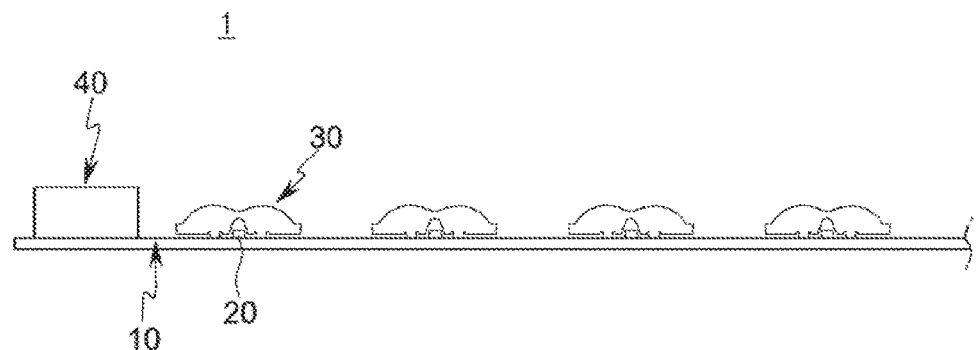
FIG. 1A and FIG. 1B are a cross-sectional view and a plan view, respectively, of a light source module according to an exemplary embodiment.

Hereinafter, exemplary embodiments will now be described in detail with reference to the accompanying drawings.

The inventive concept may, however, be exemplified in many different forms and should not be construed as being limited to the specific exemplary embodiments set forth herein. Rather, these exemplary embodiments are provided so that this disclosure will be thorough and complete, and will fully convey the scope of the inventive concept to those skilled in the art.

In the drawings, the shapes and dimensions of elements may be exaggerated for clarity, and the same reference numerals will be used throughout to designate the same or like elements. In the specification, the terms 'above', 'upper portion', 'upper surface', 'below' lower portion', 'lower surface', 'side or lateral surface' and the like, are used based on the directionality of the drawings, and may actually be different depending on a direction in which a component is disposed.

Figure 1B:
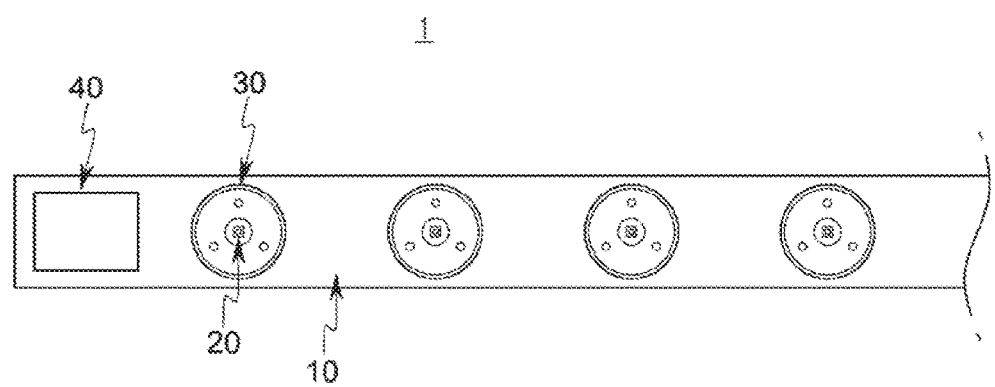
Figure 2:
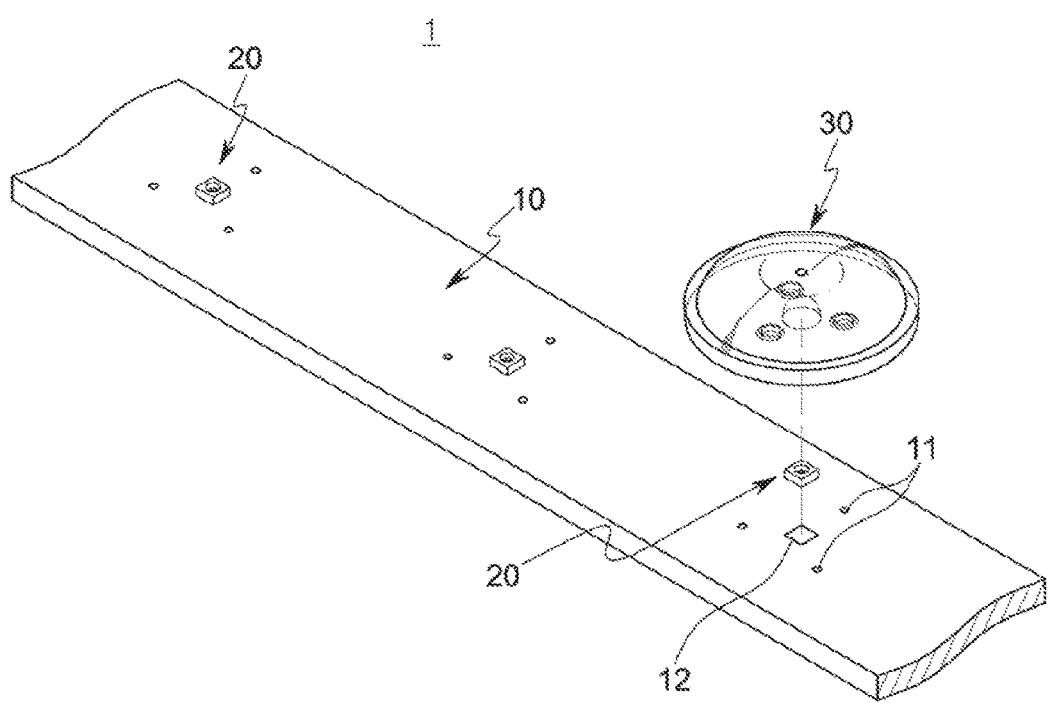
FIG. 2 is a perspective view schematically illustrating a state in which a light source and an optical device are mounted on a substrate.

Referring to FIGS. 1A and 1B and FIG. 2, a light source module comprising an optical device according to an exemplary embodiment will be described. FIG. 1A and FIG. 1B are a cross-sectional view and a plan view, respectively, of a light source module comprising an optical device according to an exemplary embodiment. FIG. 2 is a perspective view schematically illustrating a state in which a light source and the optical device are mounted on a substrate.

Referring to FIGS. 1A and 1B and FIG. 2, a light source module 1 according to an exemplary embodiment may include a substrate 10, a light source 20 mounted on the substrate 10, and an optical device 30 disposed above the light source 20.

The substrate 10 may be a printed circuit board (PCB), for example, a FR4-type PCB or a flexible PCB able to be easily deformed. The PCB may be formed of an organic resin material containing epoxy, triazine, silicon, polyimide and the like, or other organic resin materials. Alternatively, the PCB may be formed of a ceramic material such as silicon nitride, AlN, $Al_2O_3$ or the like, or may be formed of a metal and a metal compound such as a metal core printed circuit board (MCPCB), MCCL and the like.

The substrate 10 may have a rectangular bar structure having a length in a lengthwise direction. However, the structure of the substrate 10 according to an exemplary embodiment is merely provided by way of example, but is not limited thereto. The substrate 10 may be variously structured to correspond to a structure of a product on which the substrate 10 is mounted and for example, may have a circular structure or other structure.

Referring to FIG. 2, the substrate 10 may have a fiducial mark 11 and a light source mounting region 12. The fiducial mark 11 and the light source mounting region 12 may guide the optical device 30 and the light source 20 to be described later into positions for the mounting thereof, respectively. A plurality of fiducial marks 11 may be disposed along the circumferential portion of each light source mounting region 12. FIG. 2 shows three fiducial marks 11. However, this is only an example and the number of fiducial marks is not particularly limited.

In addition, the substrate 10 may have a circuit wiring electrically connected to the light source 20.

A plurality of light sources 20 may be mounted on one surface of the substrate 10 and may be arranged in the lengthwise direction thereof. The light source 20 may be an opto-electronic device generating light having a wavelength through driving power applied from the outside. The wavelength may be predetermined. The light source 20 may include, for example, a semiconductor light emitting diode (LED) including an n-type semiconductor layer and a p-type semiconductor layer, and an active layer interposed therebetween.

The light source 20 may emit blue light, green light or red light and alternatively, may emit ultraviolet light or the like. In some exemplary embodiments, the light source 20 may emit white light through being used in conjunction with a wavelength conversion material such as a phosphor.

The optical device 30 may be mounted on the substrate 10 to cover each of the plurality of light sources 20. The number of optical devices 30 may correspond to the number of the light sources 20. In addition, the optical device 30 may be mounted on the substrate 10 in such a manner as to cover each light source 20. The optical device 30 may be mounted using the fiducial marks 11 relative to each light source mounting region 12.

As shown in FIGS. 1A and 1B, in addition to the plurality of light sources 20 and optical devices 30, a connector 40 may be mounted on the substrate 10 to be connected to an external power source. The connector 40 may be disposed in one end portion of the substrate 10. However, this location is only an example, and the location of the connector 40 is not particularly limited.

In the light source module 1 according to the present exemplary embodiment, the light source 20 formed in various manners may be employed. The light source 20 may be a variously structured-light emitting diode (LED) chip or an LED package on which the LED chip is mounted.

Figure 3:
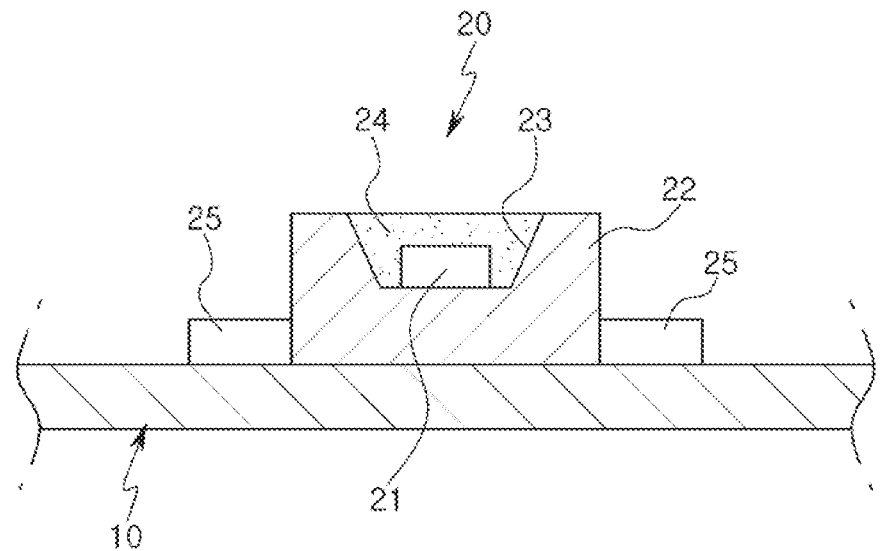
FIG. 3 is an enlarged cross-sectional view schematically illustrating the light source of FIG. 2.

FIG. 3 schematically illustrates the light source 20. As illustrated in FIG. 3, the light source 20 may have a package structure in which an LED chip 21 is mounted in a package body 22 having a reflective cup 23. The LED chip 21 may be covered by an encapsulating part 24 containing phosphors. The exemplary embodiment illustrates a case in which the light source 20 is an LED package, but is not limited thereto.

The package body 22 may correspond to a base member on which the LED chip 21 is mounted and supported thereby, and may be formed of a white molding compound having a high degree of light reflectance, whereby effects of increasing the quantity of outwardly emitted light by reflecting light emitted by the LED chip 21 may be provided. Such a white molding compound may contain a thermosetting resin having high heat resistance or a silicon resin. Alternatively, a thermoplastic resin added with a white pigment and filler, a curing agent, a release agent, an antioxidant, an adhesion improver, or the like. In addition, the white molding compound may be formed of FR-4, CEM-3, an epoxy material, a ceramic material or the like. Further, the white molding compound may be formed of a metal such as aluminum (Al).

The package body 22 may be provided with lead frames 25 for forming an electrical connection with an external power source. The lead frames 25 may be formed of a material, for example, a metal such as aluminum, copper or the like, having excellent electrical conductivity. In a case in which the package body 22 is formed of a metal, an insulating material may be interposed between the package body 22 and the lead frames 25.

The lead frames 25 may be exposed to the reflective cup 23 of the package body 22 through a bottom surface of the reflective cup 23 on which the LED chip 21 is mounted. The LED chip 21 may be electrically connected to the exposed lead frames 25.

A cross-section of the reflective cup 23 exposed to an upper surface of the package body 22 may be greater than that of the bottom surface of the reflective cup 23. That is, the internal walls facing the LED chip 21 (one of which is pointed to by the leader line for reference designator 23 in FIG. 3) may be sloped, as shown in FIG. 3. Here, the cross-section of the reflective cup 23 exposed to the upper surface of the package body 22 may define a light emitting surface of the light source 20.

The LED chip 21 may be enclosed by the encapsulating part 24 formed within the reflective cup 23 of the package body 22. The encapsulating part 24 may contain a wavelength conversion material.

The wavelength conversion material may include one or more phosphors which are excited by light generated by the LED chip 21 and emitting light of different wavelengths. By doing so, a control may be made such that various colors of light as well as white light may be emitted.

For example, in a case in which the LED chip 21 emits blue light, white light may be emitted by combining yellow, green, red, and/or orange colored phosphors. In addition, the LED chip 21 may be configured to include at least one LED chip emitting violet, blue, green, red or ultraviolet light. In this case, a color rendering index (CRI) of the LED chip 21 may be adjusted from about 40 to about 100, and the LED chip 21 may generate various types of white light with color temperatures ranging from about 2000K to about 20000K. Also, in some exemplary embodiments, the LED chip 21 may generate visible violet, blue, green, red or orange light or infrared light to adjust the color of light according to an ambient atmosphere and a desired user mood. Also, the LED chip 21 may generate a specific wavelength of light for promoting growth of plants.

Figure 12:
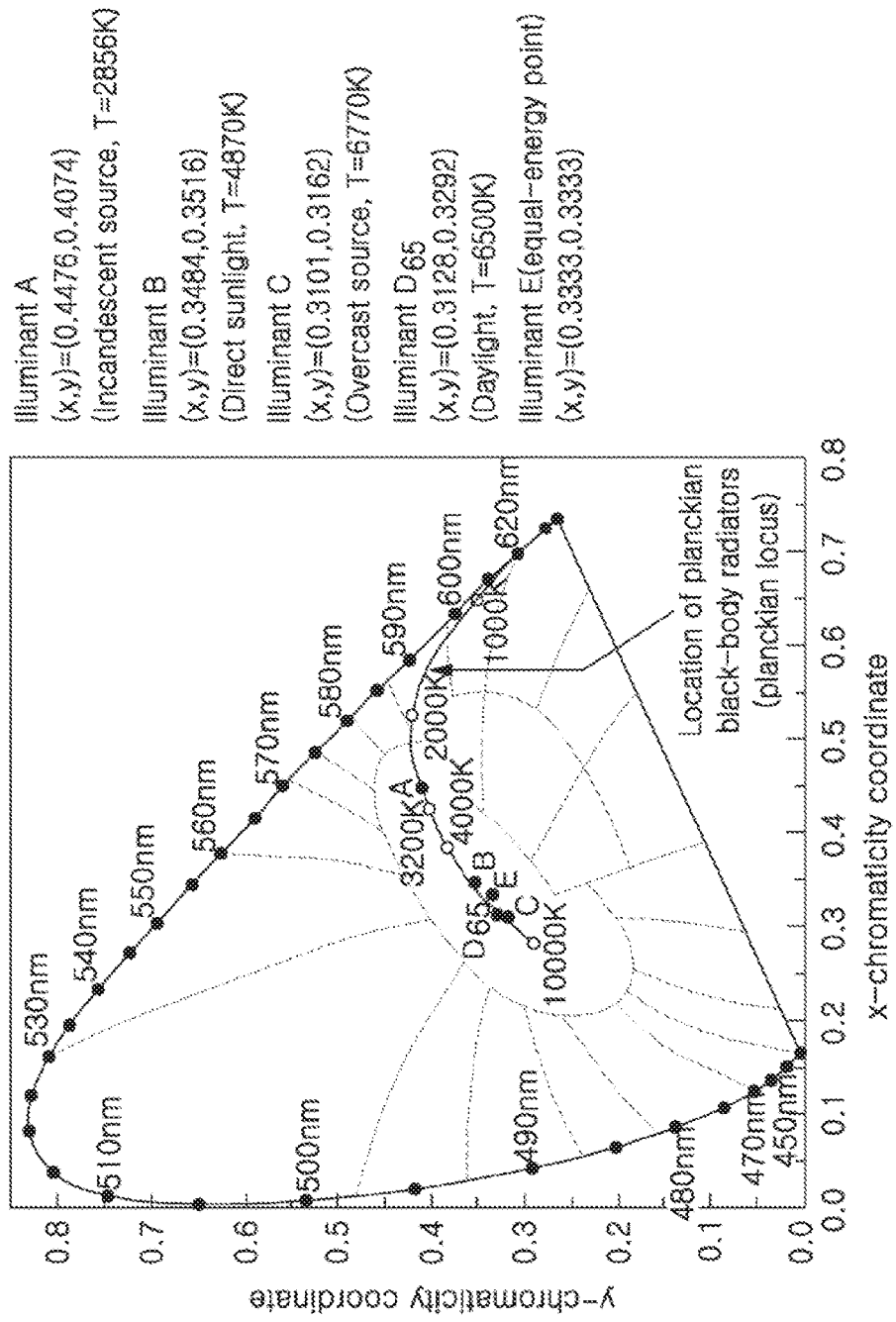
FIG. 12 is a CIE 1931 color space diagram illustrating a wavelength conversion material employable in exemplary embodiments.

White light formed by combining yellow, green, and/or red phosphors with a blue LED chip and/or combining green and red LED chips may have two or more peak wavelengths, and coordinates (x, y) thereof in the CIE 1931 chromaticity coordinates system of FIG. 12 may be positioned on a line segment connecting (0.4476, 0.4074), (0.3484, 0.3516), (0.3101, 0.3162), (0.3128, 0.3292), and (0.3333, 0.3333). Alternatively, the coordinates (x, y) may be positioned in a region surrounded by the line segment and blackbody radiation spectrum. The color temperature of white light may be within a range of about 2000K to about 20000K.

The phosphors may have the following compositional formulas and colors.

Oxides: yellow and green $Y_3Al_5O_{12}$:Ce, $Tb_3Al_5O_{12}$:Ce, $Lu_3Al_5O_{12}$:Ce Silicates: yellow and green $(Ba,Sr)_2SiO_4$:Eu, yellow and orange $(Ba,Sr)_3SiO_5$:Ce Nitrides: green β-SiAlON:Eu, yellow $La_3Si_6N_{11}$:Ce, orange α-SiAlON:Eu, red $CaAlSiN_3$:Eu, $Sr_2Si_5N_8$:Eu, $SrSiAl_4N_7$:Eu, $SrLiAl_3N_4$:Eu, $L_{4-x}(Eu_zM_{1-z})_xSi_{12-y}Al_yO_{3+x+y}N_{18-x-y}$ (0.5≤x≤3, 0<z<0.3, 0<y≤4) (e.g., Ln is at least one element selected from a group consisting of group IIIa elements and rare-earth elements, and M is at least one element selected from a group consisting of Ca, Ba, Sr and Mg)

Fluorides: KSF-based red $K_2SiF_6$:Mn$^{4+}$, $K_2TiF_6$:Mn$^{4+}$, $NaYF_4$:Mn$^{4+}$, $NaGdF_4$:Mn$^{4+}$ Phosphor compositions should conform to stoichiometry, and respective elements may be substituted with other elements of respective groups of the periodic table. For example, strontium (Sr) may be substituted with barium (Ba), calcium (Ca), magnesium (Mg), and the like within the alkaline earth group (II), and yttrium (Y) may be substituted with lanthanum (La)-based elements such as terbium (Tb), lutetium (Lu), scandium (Sc), gadolinium (Gd), and the like. Also, europium (Eu), an activator, may be substituted with cerium (Ce), terbium (Tb), praseodymium (Pr), erbium (Er), ytterbium (Yb), and the like, according to a desired energy level, and an activator may be applied alone or with a co-activator for modifying characteristics of phosphors.

In particular, in order to enhance reliability at high temperatures and high humidity, a fluoride-based red phosphor may be coated with a fluoride not containing manganese (Mn) or with organic materials thereon. The organic materials may be coated on the fluoride-based red phosphor coated with a fluoride not containing manganese (Mn). Unlike other phosphors, the fluoride-based red phosphor may realize a narrow full width at half maximum (FWHM) equal to or less than about 40 nm, and thus, the fluoride-based red phosphomay be utilized in high resolution TVs such as UHD TVs.

Further, as a material to be substituted for the phosphor, a quantum dot (QD) or the like may be used in the wavelength conversion material, and the QD may be used alone or in combination with the phosphor.

Figure 13:
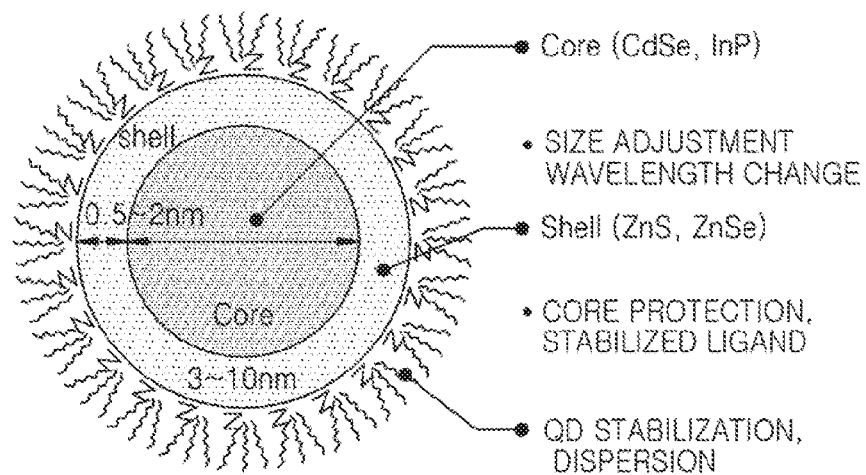
FIG. 13 is a schematic view illustrating a cross-sectional structure of a quantum dot (QD)

FIG. 13 is a view illustrating a cross-sectional structure of a quantum dot. The quantum dot may have a core-shell structure using group II-VI or group III-V compound semiconductors. For example, the quantum dot may have a core such as CdSe or InP or a shell such as ZnS or ZnSe. Also, the quantum dot may include a ligand to stabilize the core and shell. For example, the core may have a diameter ranging from about 1 nm to about 30 nm, particularly, about 3 nm to about 10 nm. The shell may have a thickness ranging from about 0.1 nm to about 20 nm, particularly, about 0.5 nm to about 2 nm.

The quantum dot may realize various colors of light according to a size thereof and, in particular, when the quantum dot is used as a phosphor substitute, the quantum dot may be substituted for a red or green phosphor. The use of the quantum dot may allow a narrow FWHM (e.g., about 35 nm) to be realized.

The exemplary embodiment exemplifies a case in which the wavelength conversion material may be contained in the encapsulating part 24, but is not limited thereto. For example, the wavelength conversion material may be manufactured as a film in advance and may be attached to a surface of the LED chip 21. In the case of using the wavelength conversion material manufactured as a film in advance, the wavelength conversion material may be easily applied to a desired region at a uniform thickness.

Hereinafter, various exemplary embodiments of the optical device used in the light source module will be described in more detail.

Figure 4:
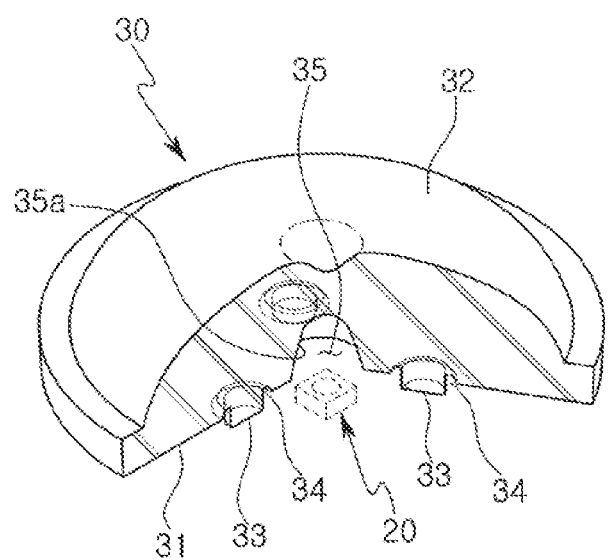
FIG. 4 is a cut-away perspective view schematically illustrating the optical device of FIG. 2.
Figure 5:
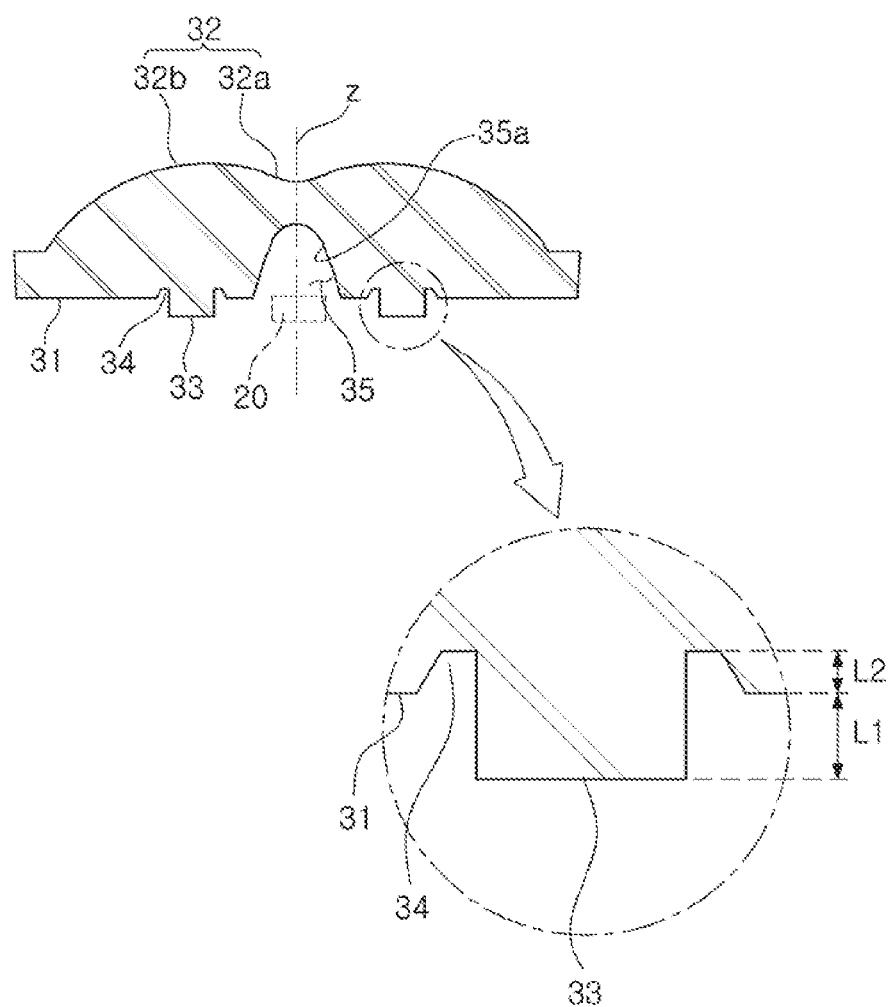
FIG. 5 is a cross-sectional view of FIG. 4.
Figure 6:
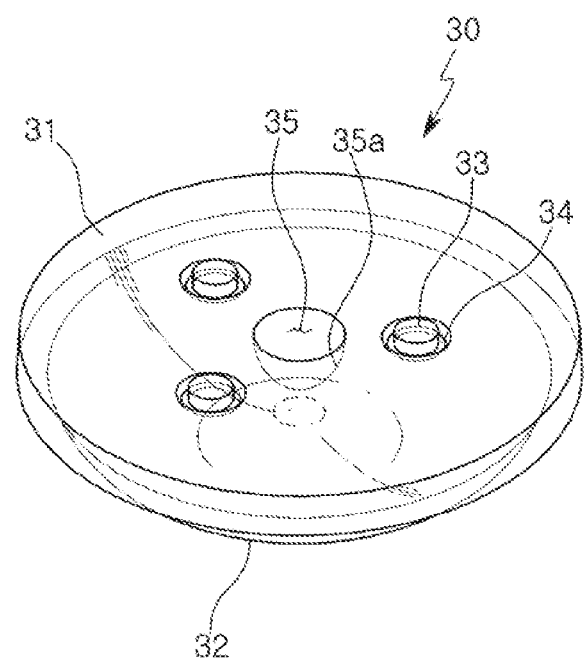
FIG. 6 is a perspective view schematically illustrating the optical device of FIG. 4, when viewed from a first surface.

With reference to FIG. 4 through FIG. 6, an optical device employable in the light source module according to an exemplary embodiment will be described. FIG. 4 is a perspective view schematically illustrating the optical device. FIG. 5 is a cross-sectional view of the optical device of FIG. 4. FIG. 6 is a bottom view of the optical device of FIG. 4.

Referring to FIG. 4 through FIG. 6, the optical device 30 may be disposed above the light source 20 and may adjust a beam angle of light emitted by the light source 20. Here, the light source 20 may include, for example, a light emitting device package. In addition, the optical device 30 may include a wide beam angle lens for implementing a wide angle of beam spread by diffusing light of the light emitting device package.

The optical device 30 may have a first surface 31 facing the optical source 20 and having an incident portion 35a, a second surface 32 emitting light incident through the incident portion 35a outwardly, a support portion 33 protruding from the first surface 31, and a blocking portion 34 surrounding the circumferential portion of the support portion 33.

The first surface 31, a surface disposed above the light source 20 and facing the light source 20, may be a bottom surface of the optical device 30. The first surface 31 may have a flat circular shape in horizontal cross-section. However, the shape is only exemplary, and the shape is not particularly limited.

A cavity 35 recessed in a light emitting direction may be provided in the center of the first surface 31 through which an optical axis Z of the light source 20 passes. The cavity 35 may have a rotational symmetry structure with respect to the optical axis Z passing through the center of the optical device 30, and a surface thereof may define the incident portion 35a through which light from the light source 20 is incident. Thus, light generated by the light source 20 may proceed through the interior of the optical device 30 through the cavity 35.

The cavity 35 may be exposed outwardly through the first surface 31 and a cross-sectional size of the cavity 35 exposed to the first surface 31 may be greater than that of the light emitting surface of the light source 20. In addition, the cavity 35 may be disposed above the light source 20 and may face the light source 20 in such a manner as to cover the light source 20.

The second surface 32 may be disposed to be opposed to the first surface 31. The second surface 32, a light emitting surface from which light incident through the incident portion 35a is refracted to be emitted outwardly, may be a top surface of the optical device 30. The second surface 32 may generally have a structure in which the second surface 32 protrudes convexly in an upward direction in which light is emitted, in a dome shape from an edge thereof connected to the first surface 31, and the center of the second surface 32 through which the optical axis Z passes is recessed concavely toward the cavity 35 and has an inflection point.

As illustrated in FIG. 5, the second surface 32 may have a first curved surface 32a having a curved surface recessed concavely toward the light source 20 and the cavity 35 along the optical axis Z, and a second curved surface 32b having a convex curve surface continuously extended to an edge thereof connected to the first surface 31 from an edge of the first curved surface 32a.

The support portion 33 may have a rod-shaped structure and may be extended in parallel with the optical axis Z in such a manner as to protrude toward the light source 20 from the first surface 31. The support portion 33 may be provided as at least two or more support portions 33. The plurality of support portions 33 may be arranged at uniform intervals around the cavity 35 positioned in the center thereof.

As discussed above, the exemplary embodiment illustrates a case in which three support portions 33 are provided, but is not limited thereto. The number of the support portions 33 may be variously modified. The support portions 33 may be formed of a material which is the same as that of the optical device 30.

The blocking portion 34 may be formed as a structure surrounding the circumferential portion of each support portion 33 on the first surface 31, the structure being stepped with respect to the first surface 31. The blocking portion 34 may be formed as a groove around the support portion 33. The blocking portion 34 may block an adhesive from being spread to the first surface 31 along the support portion 33.

The blocking portion 34 may have a groove structure recessed in a direction opposite to a protrusion direction of the support portion 33 in the first surface 31. In addition, the blocking portion 34 may contact a side surface of the support portion 33 and may allow the support portion 33 to be outwardly exposed by a distance equal to a recessed depth of the blocking portion 34. Thus, the support portion 33 may further have a length L2 corresponding to the recessed depth of the blocking portion 34, as well as having a length L1 by which the support portion 33 protrudes from the first surface 31, as shown in the inset of FIG. 5.

When a plurality of support portions 33 are provided, the number of blocking portions 34 may correspond to the number of the support portions 33, and the blocking portions 34 may be disposed in the circumferential portions of the respective support portions 33.

Figure 7:
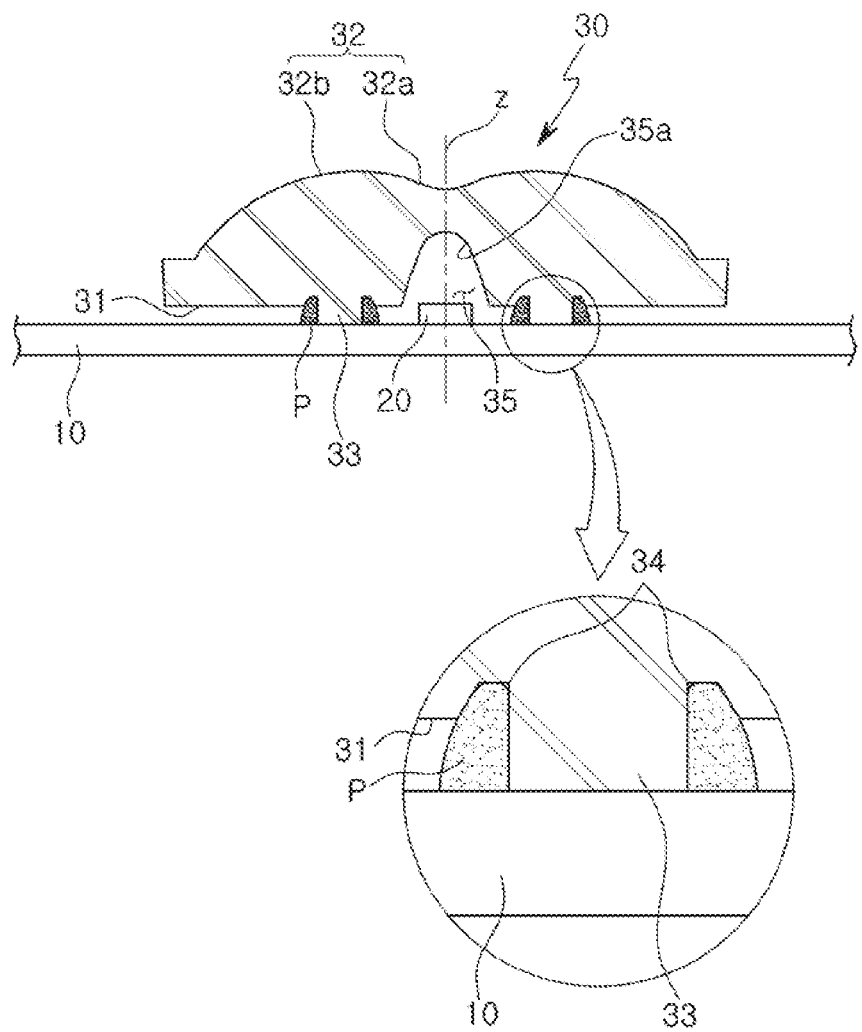
FIG. 7 is a cross-sectional view schematically illustrating a state in which the optical device is attached to the substrate by an adhesive.

FIG. 7 schematically illustrates a state in which the optical device 30 is attached to the substrate 10 by an adhesive P.

As illustrated in FIG. 7, the support portion 33 may be fixed to the substrate 10 through the adhesive P when the optical device 30 is mounted, for example, on the substrate 10. The first surface 31 may be disposed above the light source 20, and the cavity 35 may be disposed to face the light source 20. However, this is only an example, and alternatively, in some exemplary embodiments, the first surface 31 may be disposed such that the first surface 31 is parallel to a top surface of the light source 20, or slightly below a top surface of the light source 20 but not touching a top surface of the substrate 10.

The support portion 33 may be extended from the first surface 31 in a longitudinal direction parallel to the optical axis Z. In the first surface 31, the blocking portion 34 may be disposed in the form of a groove contacting the circumferential portion of the side surface of the support portion 33 and surrounding the support portion 33. The blocking portion 34 may have a groove structure in which the blocking portion 34 may be stepped with respect to the first surface 31 and the blocking portion 34 may be recessed from the first surface 31 in the direction opposite to the protrusion direction of the support portion 33, to a depth. The depth may be predetermined.

The blocking portion 34 may block the movement of the adhesive P applied to an end portion of the support portion 33. Specifically, the blocking portion 34 may prevent the adhesive P from spreading to the first surface 31 due to surface tension along the step portion connecting the blocking portion 34 and the first surface 31, and may cover the circumferential portion of the side surface of the support portion 33. Therefore, the blocking portion 34 may block the adhesive P from being spread to the first surface 31 along the support portion 33.

The optical device 30 may be formed of a resin material having light-transmissive properties, for example, polycarbonate (PC), polymethyl methacrylate (PMMA), an acrylic material, or the like. In addition, the optical device 30 may be formed of a glass material, but is not limited thereto.

The optical device 30 may contain a light dispersion material in a range of about 3% to about 15%. The light dispersion material may include at least one selected from a group consisting of $SiO_2$, $TiO_2$ and $Al_2O_3$. In a case in which the light dispersion material is included in an amount of less than about 3%, light may not be sufficiently dispersed, such that light dispersion effects may not be expected. In a case in which the light dispersion material is included in an amount of more than about 15%, a quantity of light emitted outwardly through the optical device 30 may be reduced to thereby degrade light extraction efficiency.

The optical device 30 may be formed by schemes of injecting a liquid solvent into a mold to be solidified. For example, the schemes may include an injection molding method, a transfer molding method, a compression molding method and the like.

Figure 8A:
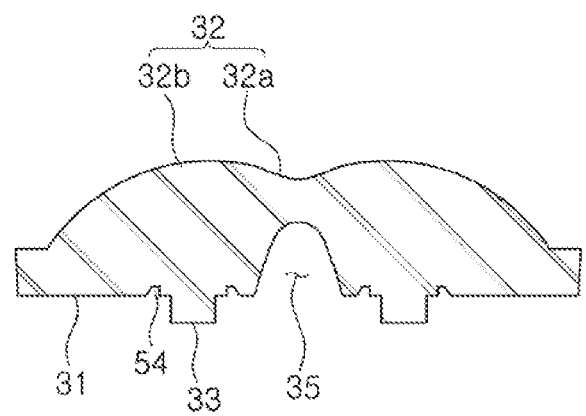
FIG. 8A and FIG. 8B are a cross-sectional view and a bottom view, respectively, of an optical device according to another exemplary embodiment.
Figure 8B:
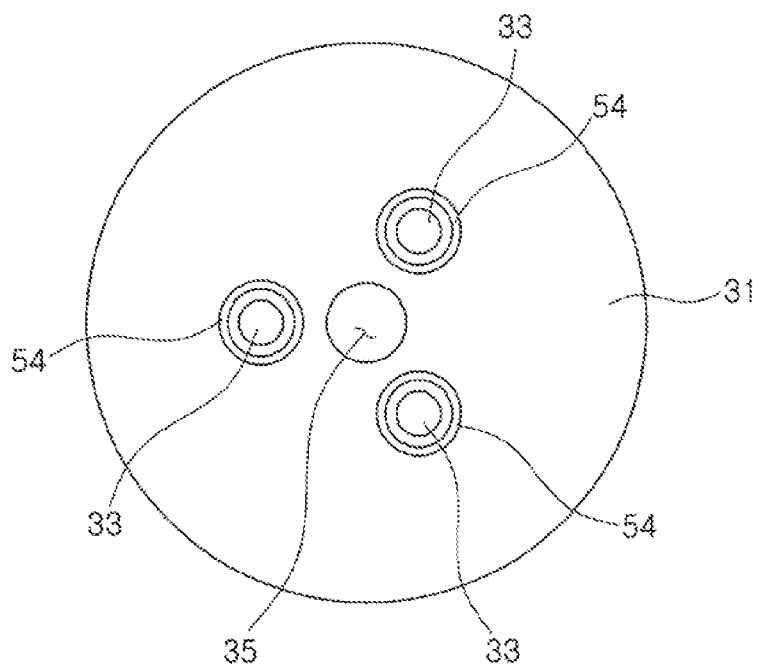

With reference to FIG. 8A and FIG. 8B, other exemplary embodiments of the optical device will be described. FIG. 8A and FIG. 8B are a cross-sectional view and a bottom view, respectively, of an optical device according to another exemplary embodiment.

The optical device according to the exemplary embodiment is substantially identical to that of the foregoing exemplary embodiment with only differences in a structure of a blocking portion.

As illustrated in FIG. 8A and FIG. 8B, a blocking portion 54 may be spaced apart from the side surface of the support portion 33 by a distance, and a region spaced apart by the distance may be formed to surround the support portion 33.

That is, unlike the case in which the blocking portion 34 according to the exemplary embodiment illustrated in FIG. 4 through FIG. 6 contacts the support portion 33, the blocking portion 54 according to the present exemplary embodiment has differences in that the blocking portion 54 is spaced apart from the support portion by a distance and is disposed around the support portion. The distance may be predetermined.

Figure 9A:
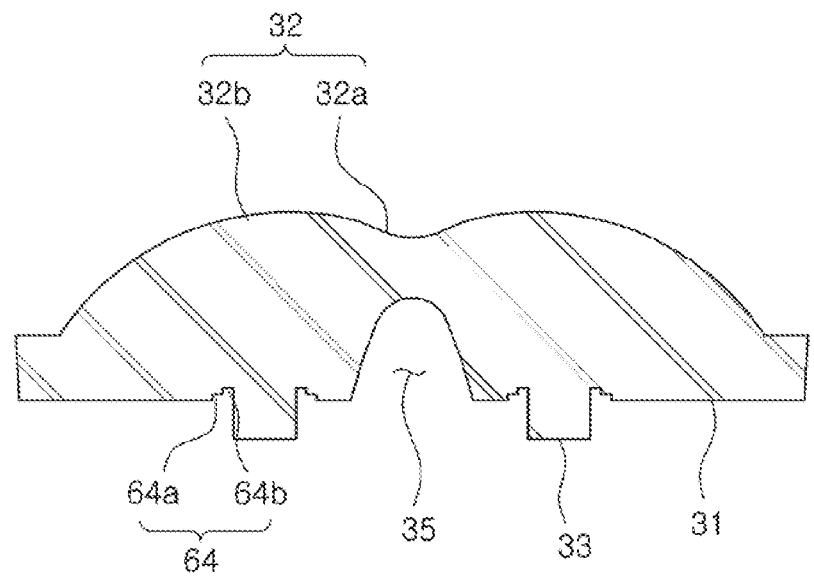
FIG. 9A and FIG. 9B are a cross-sectional view and a bottom view, respectively, of an optical device according to another exemplary embodiment.
Figure 9B:
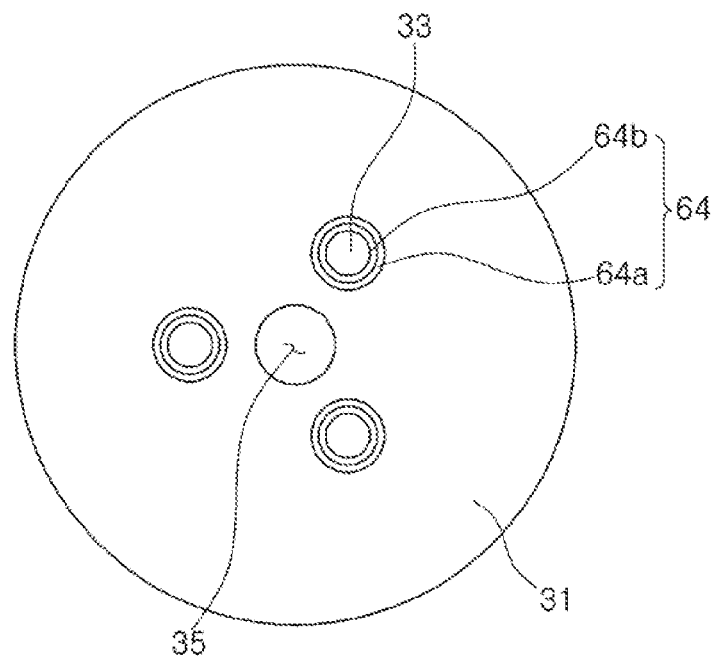

With reference to FIG. 9A and FIG. 9B, other exemplary embodiments of the optical device will be described. FIG. 9A and FIG. 9B are a cross-sectional view and a bottom view, respectively, of an optical device according to another exemplary embodiment.

The optical device according to the exemplary embodiment is substantially identical to that of the foregoing embodiment with only differences in a structure of a blocking portion.

As illustrated in FIG. 9A and FIG. 9B, a blocking portion 64 may include a first groove 64a recessed from the first surface 31 to a first depth and a second groove 64b recessed to a second depth greater than the first depth of the first groove 64a between the first groove 64a and the support portion 33. The first depth and the second depth may each be predetermined.

That is, the blocking portion 64 according to the present exemplary embodiment has differences in that the blocking portion 64 has a double-groove structure while the blocking portions 34 and 54 according to the exemplary embodiments of FIG. 4 through FIG. 6, and FIG. 8, respectively, have a single groove structure. Here, the second groove 64b may contact the side surface of the support portion 33, and the first groove 64a may be spaced apart from the support portion 33 by a distance equal to a width of the second groove 64b and may be disposed around the support portion 33.

Figure 10A:
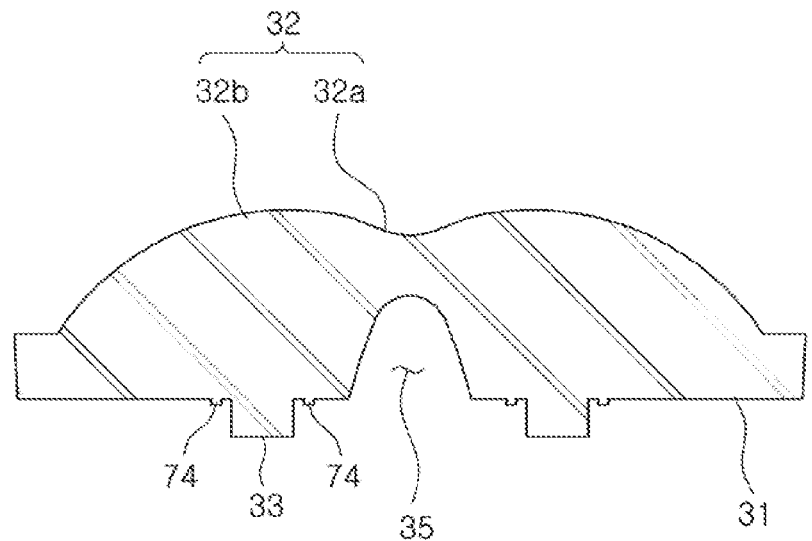
FIG. 10A and FIG. 10B are a cross-sectional view and a bottom view, respectively, of an optical device according to another exemplary embodiment.
Figure 10B:
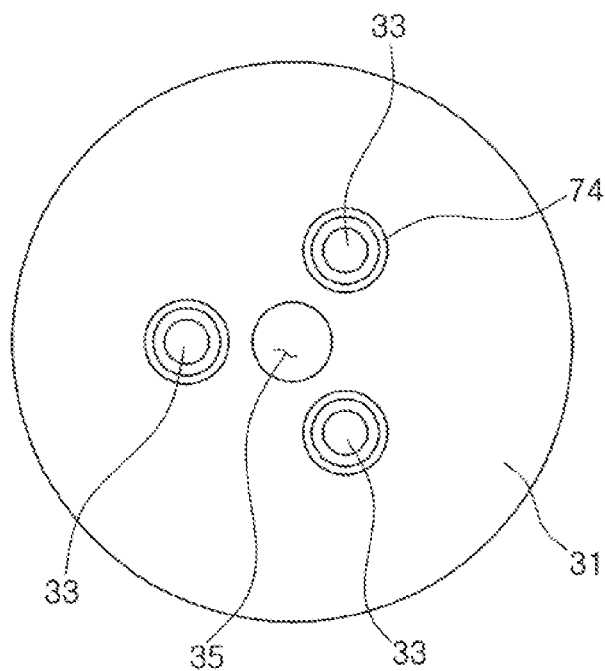

With reference to FIG. 10A and FIG. 10B, other exemplary embodiments of the optical device will be described. FIG. 10A and FIG. 10B are a cross-sectional view and a bottom view, respectively, of an optical device according to another exemplary embodiment.

The optical device according to the exemplary embodiment is substantially identical to that of the foregoing embodiment with only differences in a structure of a blocking portion.

As illustrated in FIG. 10A and FIG. 10B, a blocking portion 74 may have a dam structure in which the blocking portion 74 protrudes in parallel with the support portion 33, in a position spaced apart from the support portion 33 of the first surface 31.

That is, the blocking portion 74 according to the present exemplary embodiment has differences in that the blocking portion 74 is structured to protrude in a direction that is the same as the protrusion direction of the support portion 33 while each of the blocking portions 34, 54, and 64 according to the foregoing exemplary embodiments have a groove structure in which the blocking portion is recessed in the direction opposite to the protrusion direction of the support portion 33.

The blocking portion 74 may have a protrusion length shorter than that of a length of the support portion 33 from the first surface 31 and may be spaced apart from the support portion 33 by a distance to be disposed in ring shape around the support portion 33. The distance may be predetermined.

The adhesive P applied to an end portion of the support portion 33 may be blocked by the blocking portion 74 from spreading to the first surface 31 to cover the circumferential portion of the support portion 33. Therefore, the blocking portion 74 may block the adhesive P from being spread from the support portion 33 along the first surface 31.

As described above, the optical device 30 according to the exemplary embodiments may block the adhesive P from being widely spread to a bottom surface, that is, the first surface 31 of the optical device 30 by disposing the blocking portion 34, 54, 64, or 74 having a groove structure or a dam structure, in the circumferential portion of the support portion 33. Therefore, a defect in which the adhesive P is spread and adhered to the first surface 31 to contaminate the first surface 31 as in an existing related art case may be prevented. The adhesive P may be, for example, an epoxy adhesive.

Figure 11:
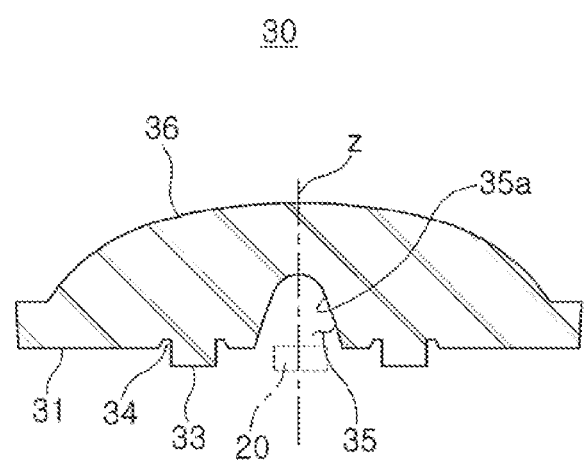
FIG. 11 is a cross-sectional view schematically illustrating an optical device according to another exemplary embodiment.

With reference to FIG. 11, an optical device according to another exemplary embodiment will be described. FIG. 11 is a cross-sectional view schematically illustrating an optical device according to another exemplary embodiment.

The optical device according to the exemplary embodiment is substantially identical to that of the foregoing embodiment with only differences in a structure of a second surface.

As illustrated in FIG. 11, a second surface 36 may generally have a structure in which the second surface 36 protrudes convexly upwardly in a dome shape from an edge thereof connected to the first surface 31, and the center of the second surface 36 through which the optical axis Z passes protrudes to a maximum height.

That is, unlike the case in which the second surface 32 according to the foregoing exemplary embodiments is structured to be recessed concavely toward the cavity 35 from the center thereof through which the optical axis Z passes, the second surface 36 according to the present exemplary embodiment may protrude to a maximum height in the center thereof.

With reference to FIG. 14 to FIG. 17, various examples of LED chips according to exemplary embodiments will be described. FIG. 14 to FIG. 17 are cross-sectional views illustrating various examples of an LED chip usable as a light source.

Figure 14:
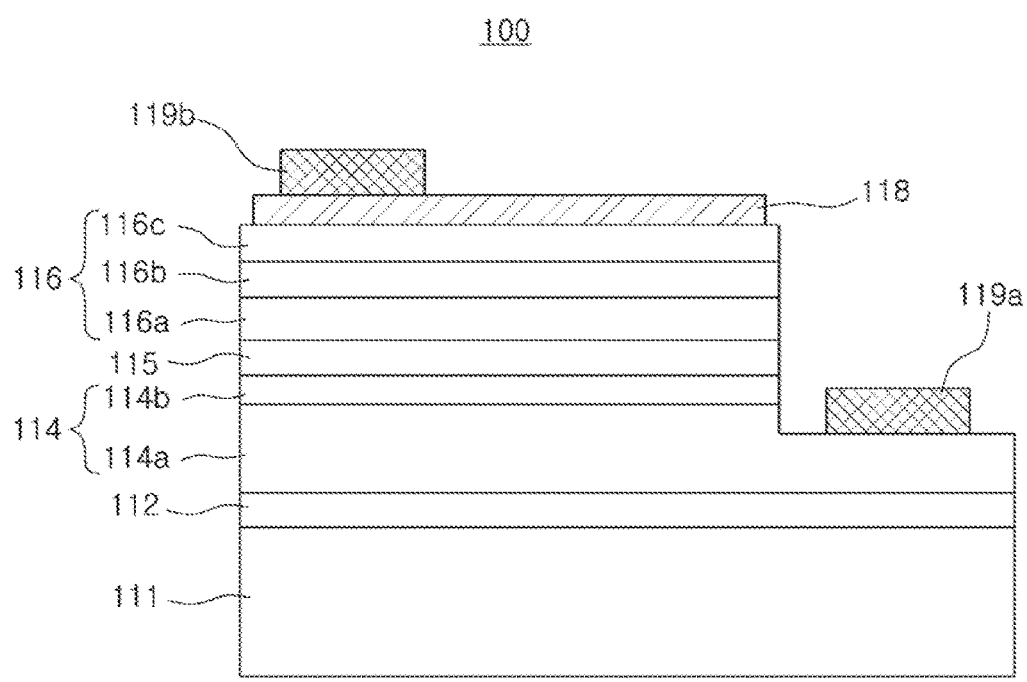
FIG. 14 is a cross-sectional view illustrating an example of an LED chip usable as a light source.

Referring to FIG. 14, an LED chip 100 may include a growth substrate 111 and a first conductivity-type semiconductor layer 114, an active layer 115, and a second conductivity-type semiconductor layer 116 sequentially disposed on the growth substrate 111. A buffer layer 112 may be disposed between the growth substrate 111 and the first conductivity-type semiconductor layer 114.

The growth substrate 111 may be an insulating substrate such as sapphire. However, the growth substrate 111 is not limited thereto and alternatively, may be a conductive substrate or semiconductor substrate, in addition to the insulating substrate. For example, the growth substrate 111 may be formed of SiC, Si, $MgAl_2O_4$, MgO, $LiAlO_2$, $LiGaO_2$, or GaN, in addition to sapphire.

The buffer layer 112 may be $In_xAl_yGa_{1-x-y}N$ ($0 \leq x \leq 1$, $0 \leq y \leq 1$, $0 \leq x+y \leq 1$). For example, the buffer layer 112 may be GaN, AlN, AlGaN, or InGaN. In some exemplary embodiments, a combination of a plurality of layers or layers formed by gradually changing a composition may also be used for the material of the buffer layer 112.

The first conductivity-type semiconductor layer 114 may be a nitride semiconductor satisfying n-type $In_xAl_yGa_{1-x-y}N$ ($0 \leq x < 1$, $0 \leq y < 1$, $0 \leq x+y < 1$), and an n-type dopant may be silicon (Si). For example, the first conductivity-type semiconductor layer 114 may include n-type GaN.

In the present exemplary embodiment, the first conductivity-type semiconductor layer 114 may include a first conductivity-type semiconductor contact layer 114a and a current spreading layer 114b. A dopant concentration of the first conductivity-type semiconductor contact layer 114a may range from about $2 \times 10^{18}$ cm$^{-3}$ to about $9 \times 10^{19}$ cm$^{-3}$. A thickness of the first conductivity-type semiconductor contact layer 114a may be about 1 μm to about 5 μm. The current spreading layer 114b may have a structure in which a plurality of $In_xAl_yGa_{(1-x-y)}N$ ($0 \leq x$, $y \leq 1$, $0 \leq x+y \leq 1$) layers having different compositions or different dopant contents are repeatedly stacked. For example, the current spreading layer 114b may be an n-type superlattice layer in which n-type GaN layers having a thickness of about 1 nm to about 500 nm and/or two or more layers having different compositions of $Al_xIn_yGa_zN$ ($0 \leq x$, $y$, $z \leq 1$, except for $x=y=z=0$) are repeatedly stacked. A dopant concentration of the current spreading layer 114b may be about $2 \times 10^{18}$ cm$^{-3}$ to about $9 \times 10^{19}$ cm$^{-3}$. In some exemplary embodiments, an insulating material layer may be additionally introduced to the current spreading layer 114b.

The second conductivity-type semiconductor layer 116 may be a nitride semiconductor layer satisfying p-type $In_xAl_yGa_{1-x-y}N$ ($0 \leq x < 1$, $0 \leq y < 1$, $0 \leq x+y < 1$), and a p-type dopant may be magnesium (Mg). For example, the second conductivity-type semiconductor layer 116 may be implemented as a single layer structure, but as in the example, may have a multilayer structure having different compositions. As illustrated in FIG. 14, the second conductivity-type semiconductor layer 116 may include an electron blocking layer (EBL) 116a, a low concentration p-type GaN layer 116b, and a high concentration p-type GaN layer 116c provided as a contact layer. For example, the electron blocking layer 116a may have a structure in which a plurality of $In_xAl_yGa_{(1-x-y)}N$ ($0 \leq x \leq 1$, $0 \leq y \leq 1$, $0 \leq x+y \leq 1$) layers having different compositions and ranging from about 5 nm to about 100 nm are stacked or may have a single layer configured of $Al_yGa_{(1-y)}N$ ($0 < y \leq 1$). An energy band gap (Eg) of the electron blocking layer 116a may be reduced in a direction away from the active layer 115. For example, Al composition of the electron blocking layer 116a may be reduced in a direction away from the active layer 115.

The active layer 115 may have a multiple quantum well (MQW) structure in which quantum well layers and quantum barrier layers are alternately stacked. For example, the quantum well and quantum barrier layers may be different compositions of $In_xAl_yGa_{1-x-y}N$ ($0 \leq x \leq 1$, $0 \leq y \leq 1$, $0 \leq x+y \leq 1$). In some exemplary embodiments, the quantum well layer may be $In_xGa_{1-x}N$ ($0 < x \leq 1$) and the quantum barrier layer may be GaN or AlGaN. A thickness of each of the quantum well and quantum barrier layers may range from about 1 nm to about 50 nm. The structure of the active layer 115 is not limited to the multiple quantum well (MQW) structure and may also be a single quantum well (SQW) structure.

The LED chip 100 may include a first electrode 119a disposed on the first conductivity-type semiconductor layer 114, and an ohmic-contact layer 118 and a second electrode 119b sequentially stacked on the second conductivity-type semiconductor layer 116.

The first electrode 119a is not limited to, but may contain, a material such as Ag, Ni, Al, Cr, Rh, Pd, Ir, Ru, Mg, Zn, Pt, Au or the like, The first electrode 119a may have a structure of a single layer or two or more layers. The LED chip 100 may further include an electrode pad layer on the first electrode 119a. The electrode pad layer may be a layer containing at least one of materials such as Au, Ni, Sn and the like.

The ohmic-contact layer 118 may be variously implemented according to a chip structure. For example, in the case of a flip chip structure, the ohmic-contact layer 118 may contain a metal such as Ag, Au, Al or the like, or a transparent conductive oxide such as ITO, ZIO, GIO or the like. In the case of a structure disposed in a reversed manner, the ohmic-contact layer 118 may be formed of a light transmissive electrode. The light transmissive electrode may be one of a transparent conductive oxide or a transparent conductive nitride. The light transmissive electrode may be at least one selected from indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$ and $Zn_{(1-x)}Mg_xO$(Zinc Magnesium Oxide, $0 \leq x \leq 1$). In some exemplary embodiments, the ohmic-contact layer 118 may contain graphene. The second electrode 119b may contain at least one of Al, Au, Cr, Ni, Ti, and Sn.

Figure 15A:
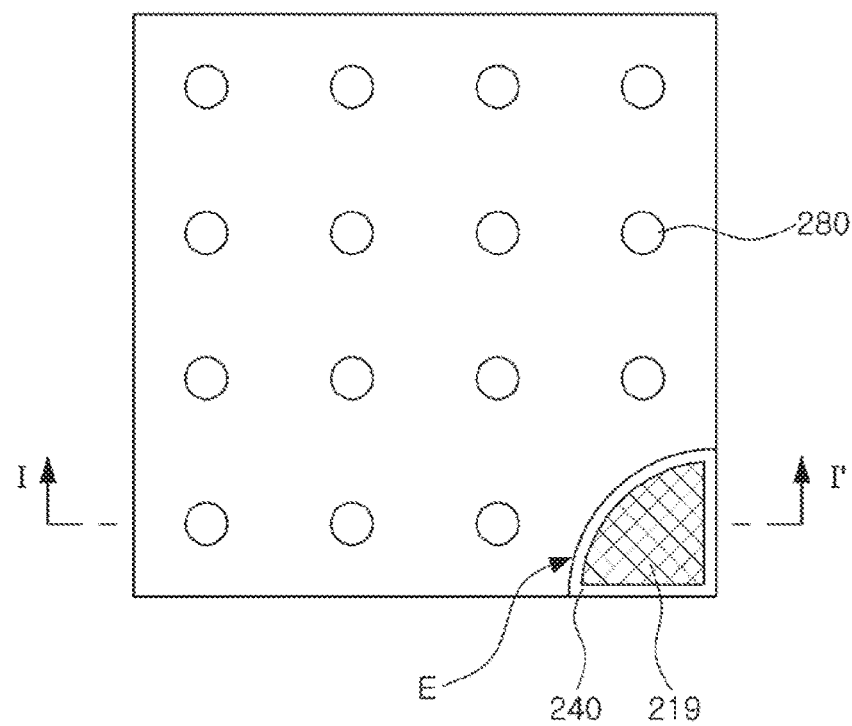
FIG. 15A is a plan view illustrating another example of an LED chip usable as a light source.
Figure 15B:
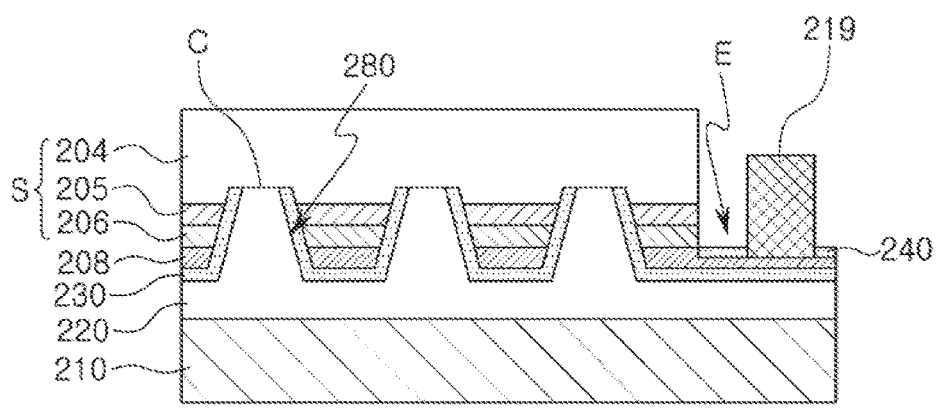
FIG. 15B is a side cross-sectional view of the LED chip illustrated in FIG. 15A, taken along line I-I'.

FIG. 15A is a plan view illustrating an example of an LED chip employable in an exemplary embodiment, and FIG. 15B is a side cross-sectional view of the LED chip illustrated in FIG. 15A, taken along line I-I'

An LED chip 200 illustrated in FIG. 15A and FIG. 15B may have a large area structure for a high lighting output. The LED chip 200 may be structured to increase current dispersion efficiency and heat radiation efficiency.

The LED chip 200 may include a light emitting laminate S, a first electrode 220, an insulating layer 230, a second electrode 208, and a conductive substrate 210. The light emitting laminate S may include a first conductivity-type semiconductor layer 204, an active layer 205, and a second conductivity-type semiconductor layer 206 sequentially stacked on one another The first electrode 220 may include one or more conductive vias 280 electrically insulated from the second conductivity-type semiconductor layer 206 and the active layer 205 and extended into at least a portion of the first conductivity-type semiconductor layer 204 in order to be electrically connected to the first conductivity-type semiconductor layer 204. The conductive vias 280 may pass through the second electrode 208, the second conductivity-type semiconductor layer 206, and the active layer 205 from an interface of the first electrode 220 and may be extended into the interior of the first conductivity-type semiconductor layer 204. The conductive vias 280 may be formed using an etching process, for example, an inductively coupled plasma-reactive ion etching (ICP-RIE) or the like.

An insulating layer 230 may be provided on the first electrode 220 to electrically insulate the first electrode 220 from other regions except for the first conductivity-type semiconductor layer 204. As illustrated in FIG. 15B, the insulating layer 230 may also be formed on a side surface of the conductive via 280, as well as between the second electrode 208 and the first electrode 220. By this structure, the second electrode 208, the second conductivity-type semiconductor layer 206, and the active layer 205 exposed to the side surface of the conductive via 280 may be insulated from the first electrode 220. The insulating layer 230 may be formed by the deposition of an insulating material such as $SiO_2$, $SiO_xN_y$, or $Si_xN_y$.

A contact region C of the first conductivity-type semiconductor layer 204 may be exposed by the conductive via 280, and a portion of the first electrode 220 may be formed to contact the contact region C through the conductive via 280. By doing so, the first electrode 220 may be connected to the first conductivity-type semiconductor layer 204.

The number, shape, and/or pitch of the conductive vias 280 and/or a contact diameter (or a contact area) thereof with respect to the first and second conductivity-type semiconductor layers 204 and 206 may be appropriately adjusted so as to reduce contact resistance. Further, the conductive vias 280 may be variously arranged in rows and columns, whereby a current flow may be improved. (Refer to FIG. 15A). The number of the conductive vias 280 or the contact area thereof may be adjusted such that an area of a contact region C may range from about 0.1% to about 20%, for example, about 0.5% to about 15%, further, about 1% to about 10%, of a planar area of the light emitting laminate S. In the case that the electrode area is less than about 0.1%, current dispersion may not be uniform so as to deteriorate light emission efficiency. On the other hand, in the case that the electrode area is greater than about 20%, a light emitting area may be relatively reduced, thereby leading to a decrease in light emission properties and luminance properties.

A radius of each conductive via 280 in the contact area coming into contact with the first conductivity-type semiconductor layer 204 may be, for example, about 1 µm to about 50 µm. The number of the conductive vias 280 may be 1 to about 48000 per region of the light emitting laminate S, depending on an area of the region of the light emitting laminate S. The number of the conductive vias 280 may be 2 to 45000, particularly, 5 to 40000, more particularly, 10 to 35000, per region of the light emitting laminate S, but may be varied depending on an area of the region of the light emitting laminate S. Distances between the respective conductive vias 280 may have a matrix structure having rows and columns of about 10 µm to about 1000 µm, for example, rows and columns of about 50 µm to about 700 µm, particularly, rows and columns of about 100 µm to about 500 µm, more particularly, rows and columns of about 150 µm to about 400 µm.

In the case that the distances between the respective conductive vias 280 are smaller than about 10 µm, the number of the conductive vias 280 may be increased while a light emitting area may be relatively reduced, thereby leading to a decrease in light emission efficiency. In the case that the distances between the respective conductive vias 280 are greater than about 1000 µm, current dispersion may not be facilitated to deteriorate light emission efficiency. Depths of the conductive vias 280 may be differently formed depending on thicknesses of the second conductivity-type semiconductor layer 206 and the active layer 205 and for example, may be range from about 0.1 µm to about 5.0 µm.

As illustrated in FIG. 15B, the second electrode 208 may provide an electrode forming region E extended and exposed outwardly from the light emitting laminate S. The electrode forming region E may include an electrode pad portion 219 for connecting an external power source to the second electrode 208. Although the present exemplary embodiment illustrates a case in which a single electrode forming region E is provided, the electrode forming region E may be provided in plural in some exemplary embodiments. As illustrated in FIG. 15A, the electrode forming region E may be formed on one edge of the LED chip 200.

As in the exemplary embodiment, an insulating layer 240 for stopping etching may be disposed in the perimeter of the electrode pad portion 219. The insulating layer 240 for stopping etching may be formed in a surrounding portion of the electrode forming region E prior to the forming of the second electrode 208 after the light emitting laminate S has been formed, and may serve as an etching stopping layer during an etching process for the electrode forming region E.

The second electrode 208 may be formed of a material having a high degree of reflectivity while forming an ohmic-contact with the second conductivity-type semiconductor layer 206. The material of the second electrode 208 may be a reflective electrode material, previously exemplified.

Figure 16:
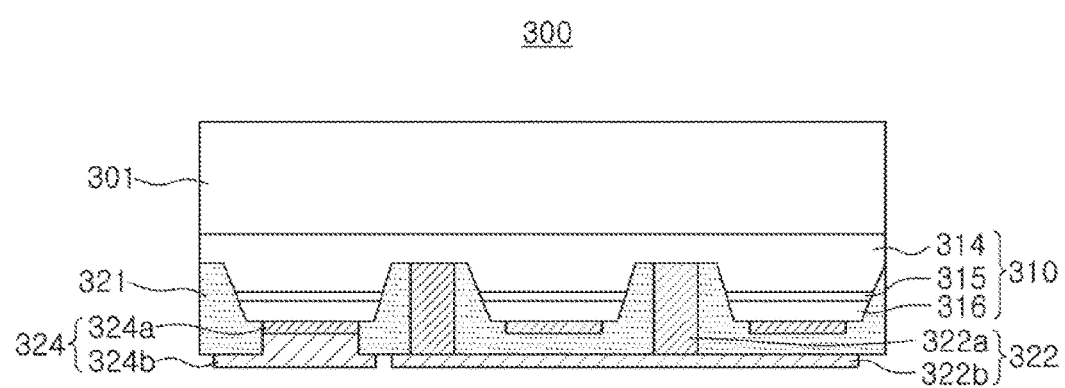
FIG. 16 is a cross-sectional view illustrating another example of an LED chip usable as a light source.

FIG. 16 is a side cross-sectional view illustrating an example of an LED chip employable in an exemplary embodiment.

Referring to FIG. 16, an LED chip 300 may include a semiconductor laminate 310 formed on a substrate 301. The semiconductor laminate 310 may include a first conductivity-type semiconductor layer 314, an active layer 315, and a second conductivity-type semiconductor layer 316.

The LED chip 300 may include a first electrode 322 and a second electrode 324 connected to the first and second conductivity-type semiconductor layers 314 and 316, respectively. The first electrode 322 may include a connection electrode portion 322a such as a conductive via, which penetrates through the second conductivity-type semiconductor layer 316 and the active layer 315 to be connected to the first conductivity-type semiconductor layer 314, and a first electrode pad 322b connected to the connection electrode portion 322a. The connection electrode portion 322a may be surrounded by an insulating portion 321 and may be electrically separated from the active layer 315 and the second conductivity-type semiconductor layer 316. The connection electrode portion 322a may be disposed in an etched region of the semiconductor laminate 310. The number, shape, and/or pitch of the connection electrode portion 322a and/or a contact area thereof with respect to the first conductivity-type semiconductor layer 314 may be appropriately provided so as to reduce contact resistance. Further, the connection electrode portion 322a may be arranged in rows and columns on the semiconductor laminate 310, whereby a current flow may be improved. The second electrode 324 may include an ohmic-contact layer 324a and a second electrode pad 324b on the second conductivity-type semiconductor layer 316.

Each of the connection electrode portion and the ohmic-contact layer 322a and 324a may include a single layer or multilayer structure of a conductive material having ohmic-characteristics with the first and second conductivity-type semiconductor layers 314 and 316. For example, the connection electrode portion and the ohmic-contact layer 322a and 324a may be formed by a process such as depositing or sputtering one or more of Ag, Al, Ni, Cr, a transparent conductive oxide (TCO) and the like.

The first and second electrode pads 322b and 324b may be connected to the connection electrode portion and the ohmic-contact layer 322a and 324a to serve as external terminals of the LED chip 300. For example, the first and second electrode pads 322b and 324b may be formed of Au, Ag, Al, Ti, W, Cu, Sn, Ni, Pt, Cr, NiSn, TiW, AuSn or eutectic metals thereof.

The first and second electrodes 322 and 324 may be disposed in the same direction and may be mounted on the lead frame or the like, in a flip-chip scheme.

The two electrodes 322 and 324 may be electrically separated from each other by the insulating portion 321. The insulating portion 321 may be formed of any material, as long as the material has electrical insulating properties and a low degree of light absorptivity. For example, the insulating portion 321 may be formed of a silicon oxide or a silicon nitride such as $SiO_2$, $SiO_xN_y$, $Si_xN_y$ or the like. In some exemplary embodiments, a light reflecting structure may be formed by dispersing light reflective fillers in a light transmissive material. By contrast, the insulating portion 321 may have a multilayer reflection structure in which a plurality of insulating layers having different refractive indices may be alternately stacked. For example, such a multilayer reflection structure may be a distributed Bragg reflector (DBR) in which a first insulating layer having a first refractive index and a second insulating layer having a second refractive index are alternately stacked.

The multilayer reflection structure may be formed by repeatedly stacking a plurality of insulating layers having different reflective indices 2 times to about 100 times, for example, 3 times to about 70 times, further, 4 times to about 50 times. The plurality of insulating layers of the multilayer reflection structure may be formed of an oxide or nitride and combinations thereof, such as $SiO_2$, SiN, $SiO_xN_y$, $TiO_2$, $Si_3N_4$, $Al_2O_3$, TiN, AlN, $ZrO_2$, TiAlN, TiSiN or the like. For example, when a wavelength of light generated in the active layer is λ, and a refractive index of the corresponding layer is n, the first insulating layer and the second insulating layer may be formed to have a thickness of λ/4n, about 300 Å to about 900 Å. In the case, the refractive indices and thickness of the first insulating layer and the second insulating layer may be selectively designed such that the insulating layers have a high degree of reflectance (95% or more) with respect to the wavelength of light generated in the active layer 315.

The refractive indices of the first insulating layer and the second insulating layer may be determined within a range of about 1.4 to about 2.5 and may be lower than refractive indices of the first conductivity-type semiconductor layer 314 and the substrate, but may also be higher than the refractive index of the substrate while being lower than the refractive index of the first conductivity-type semiconductor layer 314.

Figure 17:
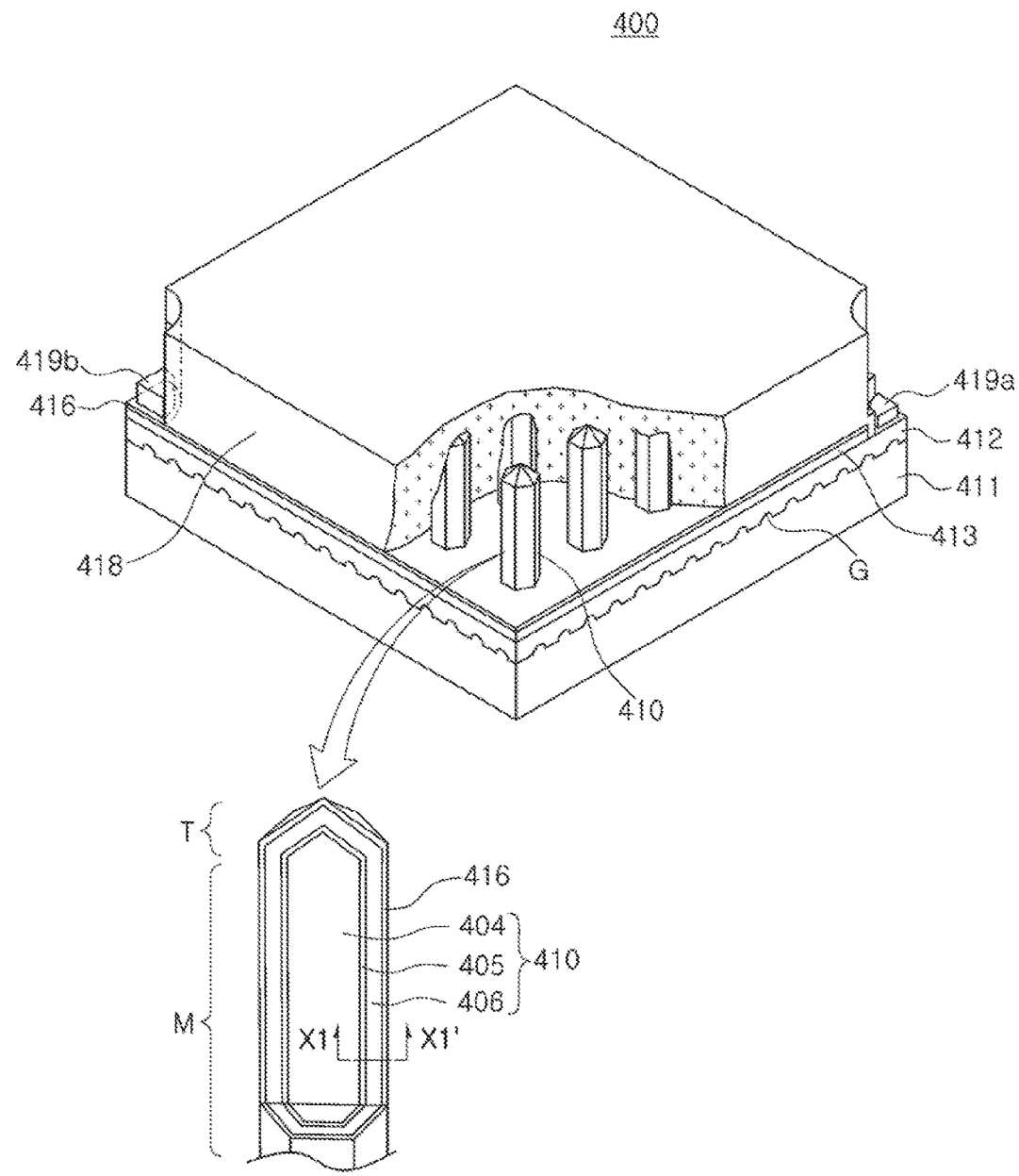
FIG. 17 is a cross-sectional view illustrating another example of an LED chip usable as a light source.

FIG. 17 is a cross-sectional view illustrating another example of an LED chip employable in an exemplary embodiment.

Referring to FIG. 17, an LED chip 400 may include a base layer 412 formed of a first conductivity-type semiconductor material and a plurality of light emitting nanostructures 410 disposed thereon.

The LED chip 400 may include a substrate 411 having an upper surface on which the base layer 412 is disposed. An unevenness structure G may be formed on the upper surface of the substrate 411. The unevenness structure G may improve light extraction efficiency and may enhance quality of a grown single-crystal. The substrate 411 may be an insulating substrate, a conductive substrate or a semiconductor substrate. For example, the substrate 411 may be sapphire, SiC, Si, $MgAL_2O_4$, MgO, $LiAlO_2$, $LiGaO_2$, or GaN.

The base layer 412 may contain a first conductivity-type nitride semiconductor layer and may provide a growth surface for growth of the light emitting nanostructures 410. The base layer 412 may be a nitride semiconductor satisfying $In_xAl_yGa_{1-x-y}N$ (0≤x<1, 0≤y<1, 0≤x+y<1) and may be doped with an n-type dopant such as Si. For example, the base layer 412 may be n-type GaN.

An insulating layer 413 having openings for growth of the light emitting nanostructures 410 (in particular, nanocores 404) may be formed on the base layer 412. The nanocores 404 may be formed on regions of the base layer 412 exposed by the openings. The insulating layer 413 may be used as a mask for growth of the nanocores 404. For example, the insulating layer 413 may be formed of an insulating material such as $SiO_2$ or $SiN_x$.

Each of the light emitting nanostructures 410 may include a main portion M having a hexagonal prismatic structure and an upper end portion T positioned on the main portion M. Side surfaces of the main portion M of the light emitting nanostructure 410 may have the same crystal faces, and the upper end portion T of the light emitting nanostructure 410 may have crystal faces different from those of the side surfaces thereof. The upper end portion T of the light emitting nanostructure 410 may have a hexagonal pyramid shape. The division of such a structure may be actually determined by the nanocore 404, and the nanocore 404 may be understood as being divided into a main portion M and an upper end portion T.

Each of the light emitting nanostructures 410 may have the nanocore 404 formed of a first conductivity-type nitride semiconductor, an active layer 405 and a second conductivity-type nitride semiconductor layer 406 sequentially disposed on a surface of the nanocore 404.

The LED chip 400 may include a contact electrode 416 connected to the second conductivity-type nitride semiconductor layer 406. The contact electrode 416 employed in the present exemplary embodiment may be formed of a conductive material having light transmissive properties. The contact electrode 416 may ensure emission of light toward the light emitting nanostructures (in a direction opposite to the substrate). Although not limited thereto, the contact electrode 416 may be one of a transparent conductive oxide layer or transparent conductive nitride layer. For example, the contact electrode 416 may be at least one selected from indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$ and $Zn_{(1-x)}Mg_xO$(Zinc Magnesium Oxide, $0 \leq x \leq 1$). In some exemplary embodiments, the contact electrode 416 may contain graphene.

A material of the contact electrode 416 is not limited to a light transmissive material and in some exemplary embodiments, may have a reflective electrode structure. For example, the contact electrode 416 may contain a material such as Ag, Ni, Al, Rh, Pd, Ir, Ru, Mg, Zn, Pt, Au or the like, and may have a structure of two or more layers such as Ni/Ag, Zn/Ag, Ni/Al, Zn/Al, Pd/Ag, Pd/Al, Ir/Ag, Ir/Au, Pt/Ag, Pt/Al, Ni/Ag/Pt and the like. The contact electrode 416 may employ such a reflective electrode structure and may be implemented in a flip-chip structure.

An insulating protective layer 418 may be formed on the light emitting nanostructures 410. The insulating protective layer 418 may be a passivation layer for protecting the light emitting nanostructures 410. In addition, the insulating protective layer 418 may be formed of a material having light transmissive properties so as to extract light generated in the light emitting nanostructures 410. In this case, as a material of the insulating protective layer 418, a material having an appropriate refractive index may be selected to thereby improve light extraction efficiency.

As in the present exemplary embodiment, after forming the contact electrode 416, a space between the plurality of light emitting nanostructures 410 may be filled with the insulating protective layer 418. The insulating protective layer 418 may be formed of an insulating material such as $SiO_2$ or $SiN_x$. For example, the insulating protective layer 418 may be formed of a material such as TEOS (TetraEthylOrthoSilane), BPSG (BoroPhospho Silicate Glass), CVD-$SiO_2$, SOG (Spin-on Glass), or SOD (Spin-on Delectric).

However, the present exemplary embodiment is not limited to a case in which the insulating protective layer 418 fills the space between the light emitting nanostructures 410. For example, in another exemplary embodiment, the space between the light emitting nanostructures 410 may be filled with an electrode component (for example, a reflective electrode material) such as the contact electrode 416.

The LED chip 400 may include a first electrode 419a and a second electrode 419b. The first electrode 419a may be disposed on an exposed portion of the base layer 412 formed of the first conductivity-type semiconductor. In addition, the second electrode 419b may be disposed on an exposed extension portion of the contact electrode 416. The arrangements of the electrodes are not limited thereto and depending on environments, a variety of different electrode arrangements may be provided.

In the case of the LED chip 400 having a core/shell-type nanostructure, a bond density thereof is low and accordingly, a relatively less amount of heat may be emitted, a light emission area may be increased by using a nanostructure to increase light emission efficiency, and a non-polar active layer may be obtained to prevent a deterioration in efficiency due to polarization, such that droop characteristics may be improved.

In addition, the plurality of light emitting nanostructures 410 may emit light having two or more different wavelengths by varying diameters or intervals (pitches) of a plurality of open regions of the mask layer, or an indium (In) component or a doping concentration introduced in the active layer 405 of each light emitting nanostructure. White light may be implemented in a single device without the use of phosphors by appropriately controlling light having different wavelengths. Another LED chip or a wavelength conversion material such as a phosphor may be combined with such a device, whereby light having desired various colors or white light having a different color temperature may be implemented.

Figure 18:
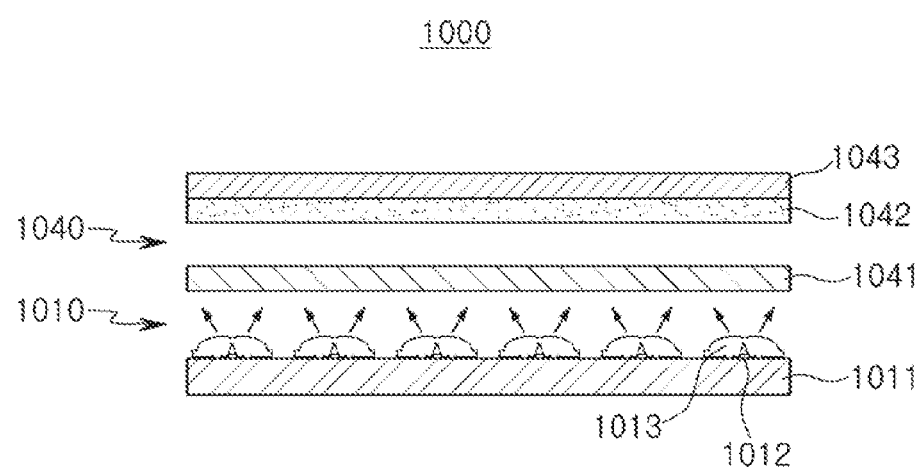
FIG. 18 is a cross-sectional view schematically illustrating a lighting device according to an exemplary embodiment.
Figure 19:
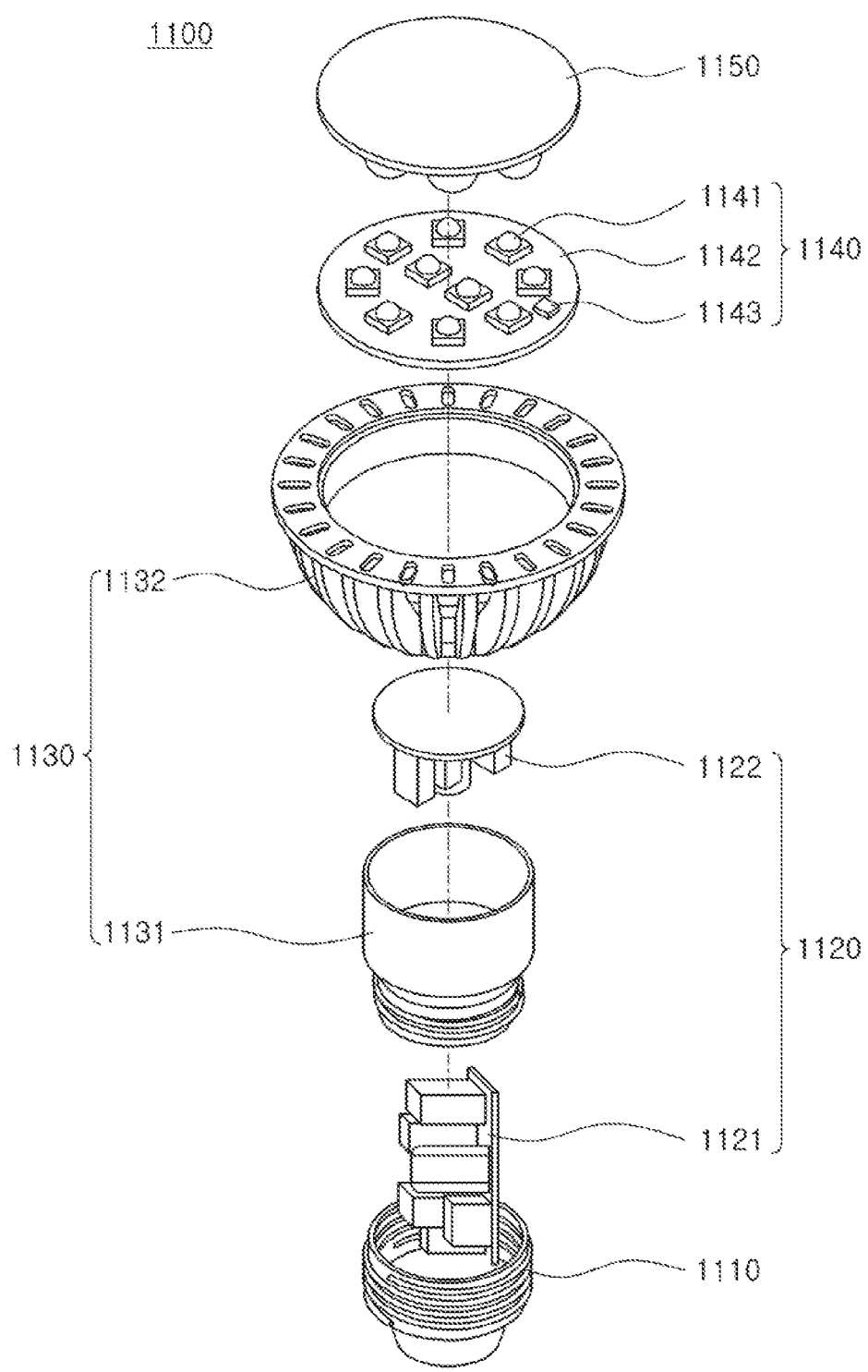
FIG. 19 is an exploded perspective view schematically illustrating a lighting device (bulb type) according to an exemplary embodiment.
Figure 20:
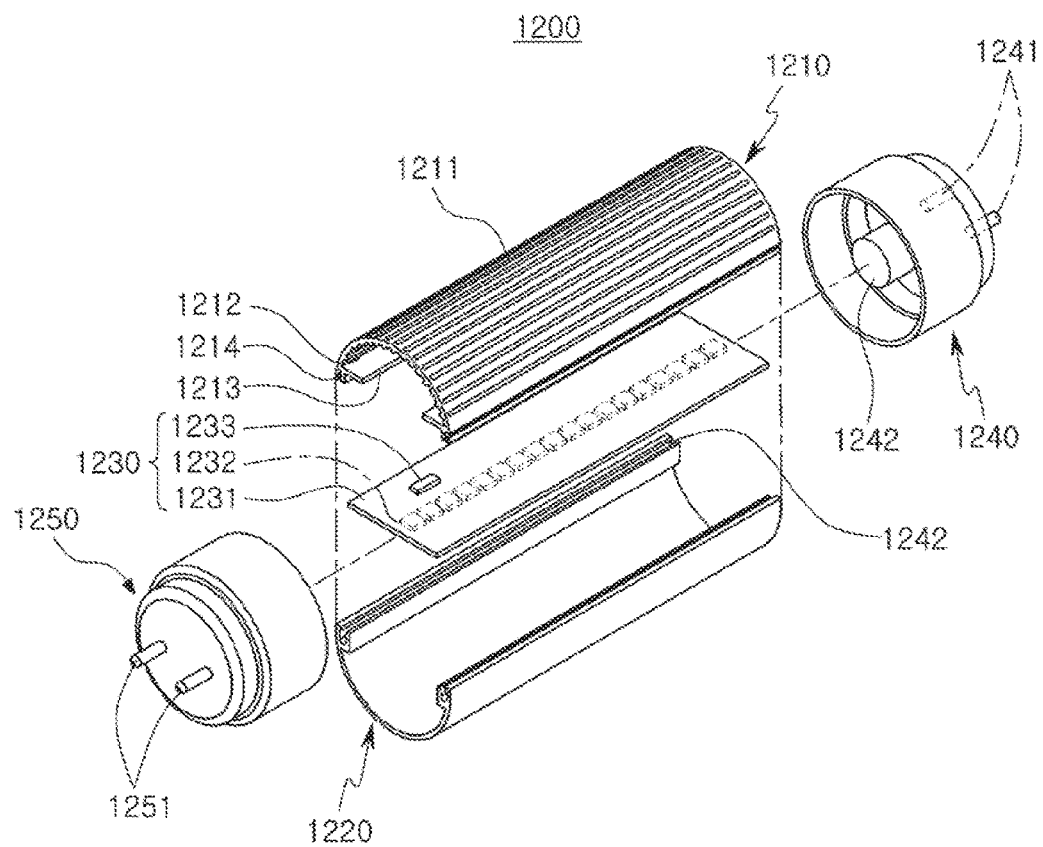
FIG. 20 is an exploded perspective view schematically illustrating a lighting device (L lamp type) according to an exemplary embodiment.

With reference to FIG. 18 through FIG. 20, various embodiments of a lighting device employing a light source module according to an exemplary embodiment will be described FIG. 18 schematically illustrates a lighting device according to an exemplary embodiment. Referring to FIG. 18, a lighting device 1000 may have, by way of example, a surface light source type structure, and may be a direct type backlight.

The lighting device 1000 according to the present exemplary embodiment may include an optical sheet 1040 and a light source module 1010 arranged below the optical sheet 1040.

The optical sheet 1040 may include a diffusion sheet 1041, a light collecting sheet 1042, a protective sheet 1043, and the like.

The light source module 1010 may include a printed circuit board 1011, a plurality of light sources 1012 mounted on an upper surface of the printed circuit board 1011, and a plurality of optical devices 1013 disposed above the plurality of respective light sources 1012. In the present exemplary embodiment, the light source module 1010 may have a structure similar to the light source module 1 of FIGS. 1A and 1B. A concrete description regarding respective components of the light source module 1010 may be understood with reference to the foregoing exemplary embodiment (for example, please refer to FIGS. 1A and 1B and their associated description above), and thus repeated description will be omitted for conciseness.

FIG. 19 is an exploded perspective view schematically illustrating a bulb type lamp as a lighting device according to an exemplary embodiment.

A lighting device 1100 may include a socket 1110, a power source module 1120, a heat dissipation module 1130, a light source module 1140, and an optical module 1150. According to an exemplary embodiment, the light source module 1140 may include a light emitting device array, and the power source module 1120 may include a light emitting device driving module.

The socket 1110 may be configured to be replaced with an existing lighting device. Power supplied to the lighting device 1100 may be applied through the socket 1110. As illustrated, the power source module 1120 may include a first power source component 1121 and a second power source component 1122. The first power source component 1121 and the second power source component 1122 may be separately provided and assembled to form the power source module 1120.

The heat dissipation module 1130 may include an internal heat dissipation module 1131 and an external heat dissipation module 1132. The internal heat dissipation module 1131 may be directly connected to the light source module 1140 and/or the power source module 1120 to thereby transmit heat to the external heat dissipation module 1132.

The optical module 1150 may include an internal optical module and an external optical module and may be configured to evenly distribute light emitted by the light source module 1140.

The light source module 1140 may emit light to the optical module 1150 upon receiving power from the power source module 1120. The light source module 1140 may include one or more light emitting devices 1141, a circuit board 1142, and a controller 1143. The controller 1143 may store driving information of the light emitting devices 1141.

In the present exemplary embodiment, the light source module 1140 may have a structure similar to the light source module 1 of FIGS. 1A and 1B. A concrete description regarding respective components of the light source module 1140 may be understood with reference to the foregoing exemplary embodiment (for example, please refer to FIGS. 1A and 1B and their associated description), and thus a repeated description will be omitted for conciseness.

FIG. 20 is an exploded perspective view schematically illustrating a bar type lamp as a lighting device according to an exemplary embodiment.

A lighting device 1200 includes a heat dissipation member 1210, a cover 1220, a light source module 1230, a first socket 1240, and a second socket 1250. A plurality of heat dissipation fins 1211 and 1212 may be formed in a concavo-convex pattern on an internal or/and external surface of the heat dissipation member 1210, and the heat dissipation fins 1211 and 1212 may be designed to have various shapes and intervals (spaces) therebetween. A support portion 1213 having a protruded shape may be formed on an inner side of the heat dissipation member 1210. The light source module 1230 may be fixed to the support portion 1213. Stoppage protrusions 1214 may be formed on both ends of the heat dissipation member 1210.

The stoppage recesses 1221 may be formed in the cover 1220, and the stoppage protrusions 1214 of the heat dissipation member 1210 may be coupled to the stoppage recesses 1221. The positions of the stoppage recesses 1221 and the stoppage protrusions 1214 may be interchanged.

The light source module 1230 may include a light emitting device array. The light source module 1230 may include a PCB 1231, one or more light sources 1232 each having an optical device, and a controller 1233. As described above, the controller 1233 may store driving information of the light sources 1232. Circuit wirings are formed on the PCB 1231 to operate the light sources 1232. Also, components for operating the light sources 1232 may be provided. In the present exemplary embodiment, the light source module 1230 is substantially identical to the light source module 1 of FIGS. 1A and 1B, and thus a detailed description thereof will be omitted for conciseness.

The first and second sockets 1240 and 1250, a pair of sockets, are respectively coupled to opposing ends of the cylindrical cover including the heat dissipation member 1210 and the cover 1220. For example, the first socket 1240 may include electrode terminals 1241 and a power source device 1242, and dummy terminals 1251 may be disposed on the second socket 1250. Also, an optical sensor and/or a communications module may be installed in either the first socket 1240 or the second socket 1250. For example, the optical sensor and/or the communications module may be installed in the second socket 1250 in which the dummy terminals 1251 are disposed. In another example, the optical sensor and/or the communications module may be installed in the first socket 1240 in which the electrode terminals 1241 are disposed.

The lighting device using the light emitting device may be classified as an indoor lighting device and an outdoor lighting device. Indoor LED lighting devices may be generally provided to replace or retrofit existing lighting devices, and may include bulb type lamps, fluorescent lamps (LED-tubes), and flat type illumination devices. Outdoor LED lighting devices may include street lamps, security lamps, floodlighting lamps, scenery lamps, traffic lights, and the like.

The lighting device using LEDs may be employed as internal or external light sources of vehicles. Internal light sources of vehicles may include interior lights, reading lights, dashboard light sources, and the like. External light sources of vehicles may include various light sources such as headlights, brake lights, turn indicators, fog lights, running lights and the like.

In addition, as light sources used for robots or various mechanical devices, LED lighting devices may be used. In particular, LED lighting devices using specific waveform bands may promote the growth of plants and may stabilize human emotions or treat illnesses in humans.

As set forth above, according to exemplary embodiments, an optical device capable of increasing optical uniformity and a light source module including the same may be provided.

While exemplary embodiments have been shown and described above, it will be apparent to those skilled in the art that modifications and variations could be made without departing from the spirit and scope of the present disclosure as defined by the appended claims.

What is claimed is:

1. An optical device comprising:
a first surface having an incident portion;
a second surface configured to emit light incident through the incident portion outwardly;
a support portion protruding from the first surface; and
a blocking portion surrounding an outer portion of the support portion, the blocking portion being stepped with respect to the first surface,
wherein the support portion protrudes in a protrusion direction, and the blocking portion has a groove structure recessed in the first surface in a direction opposite to the protrusion direction of the support portion, and wherein the blocking portion is spaced apart from a side surface of the support portion by a distance, and a region spaced apart by the distance surrounds the support portion.

2. The optical device of claim 1, wherein the blocking portion contacts a side surface of the support portion and a proximal end of the support portion is exposed by the blocking portion by a distance equal to a recessed depth of the blocking portion.

3. The optical device of claim 1, wherein the blocking portion includes a first groove recessed from the first surface to a first depth, and a second groove recessed to a second depth greater than the first depth and disposed between the first groove and the support portion.

4. The optical device of claim 1, wherein the support portion protrudes in a protrusion direction, and the blocking portion has a dam structure in which the blocking portion protrudes in parallel in the protrusion direction with the support portion, the dam structure provided at a position spaced apart from the support portion along the first surface.

5. The optical device of claim 4, wherein the blocking portion has a protrusion length shorter than a protrusion length of the support portion.

6. The optical device of claim 1, wherein the first surface has a cavity in a central portion thereof, the cavity being recessed toward the second surface to define the incident portion.

7. The optical device of claim 1, wherein the second surface protrudes convexly in a proceeding direction of light along an optical axis Z, and a central portion of the second surface through which the optical axis Z passes has an inflection point recessed concavely toward the first surface.

8. The optical device of claim 1, wherein the second surface has a first curved surface recessed concavely toward the first surface along an optical axis thereof, and a second curved surface having a convex curve surface continuously extended from the first curved surface to an edge.

9. A light source module comprising:
a substrate;
a light source mounted on the substrate; and
an optical device disposed above the light source,
wherein the optical device includes:
  a first surface having an incident portion;
  a second surface configured to emit light incident through the incident portion outwardly;
  a support portion protruding from the first surface and fixed to the substrate using an adhesive; and
  a blocking portion surrounding an outer portion of the support portion to prevent the adhesive from being spread along the first surface from the support portion, the blocking portion being stepped with respect to the first surface, wherein the support portion protrudes in a protrusion direction,
wherein the blocking portion has a groove structure recessed in the first surface in a direction opposite to the protrusion direction of the support portion, and
wherein the groove structure is filled with the adhesive.

10. The light source module of claim 9, wherein the incident portion is positioned in a central position of the first surface,
wherein the support portion includes a plurality of support portions provided between the incident portion and an outer edge of the first surface, and arranged around the incident portion, and
wherein the blocking portion is provided for each of the plurality of support portions and is disposed surrounding an outer portion of each of the plurality of support portions.

11. The light source module of claim 9, wherein the first surface has a cavity recessed toward the second surface to define the incident portion, in a central portion thereof, the cavity being disposed to face the light source.

12. The light source module of claim 9, wherein the light source comprises a light emitting diode (LED) chip or a LED package on which the LED chip is mounted.

13. The light source module of claim 12, wherein the light source further comprises an encapsulating part covering the LED chip.

14. A light source module comprising:
a substrate:
an optical device that covers a light source and is disposed on the substrate, the optical device comprising:
  a surface extending parallel to the substrate;
  a protrusion extending perpendicular to the surface and fixed to the substrate via an adhesive applied to at least sides thereof; and
  a groove surrounding the protrusion that prevents the adhesive from spreading along the surface from sides of the protrusion,
wherein the groove is formed in the surface and is spaced apart along the surface by a first distance from a side of the protrusion.

15. The light source module of claim 14, wherein the groove comprises a first groove having a first depth into the surface and a second groove having a second depth into the surface greater than the first depth.

16. The light source module of claim 14, further comprising a dam protrusion that extends perpendicular to the surface and is spaced apart from the protrusion by a second distance to define the groove.

* * * * *